(12) United States Patent
Richardson et al.

(10) Patent No.: US 7,670,950 B2
(45) Date of Patent: Mar. 2, 2010

(54) COPPER METALLIZATION OF THROUGH SILICON VIA

(75) Inventors: Thomas B. Richardson, Killingworth, CT (US); Yun Zhang, Warren, NJ (US); Chen Wang, New Haven, CT (US); Vincent Paneccasio, Jr., Madison, CT (US); Cai Wang, Milford, CT (US); Xuan Lin, Northford, CT (US); Richard Hurtubise, Clinton, CT (US); Joseph A. Abys, Warren, NJ (US)

(73) Assignee: Enthone Inc., West Haven, CT (US)

( * ) Notice: Subject to any disclaimer, the term of this patent is extended or adjusted under 35 U.S.C. 154(b) by 0 days.

(21) Appl. No.: 12/185,641

(22) Filed: Aug. 4, 2008

(65) Prior Publication Data
US 2009/0035940 A1    Feb. 5, 2009

Related U.S. Application Data

(60) Provisional application No. 61/059,039, filed on Jun. 5, 2008, provisional application No. 60/953,602, filed on Aug. 2, 2007.

(51) Int. Cl.
*H01L 21/44* (2006.01)

(52) U.S. Cl. .................. 438/675; 438/42; 438/361; 438/533; 257/E21.174; 257/E21.575; 257/E21.585

(58) Field of Classification Search .......... 438/42, 438/361, 408, 441, 523, 524, 533
See application file for complete search history.

(56) References Cited

U.S. PATENT DOCUMENTS

| | | | |
|---|---|---|---|
| 4,110,176 A | 8/1978 | Creutz et al. | |
| 4,389,505 A | 6/1983 | Hungerford | |
| 6,444,110 B2 | 9/2002 | Barstad et al. | |
| 6,518,182 B1 | 2/2003 | Ishikawa et al. | |
| 6,544,399 B1 | 4/2003 | Landau et al. | |
| 6,551,487 B1 | 4/2003 | Reid et al. | |
| 6,596,151 B2 | 7/2003 | Landau et al. | |
| 6,607,654 B2 | 8/2003 | Lee et al. | |
| 6,610,191 B2 | 8/2003 | Landau et al. | |
| 6,638,411 B1 | 10/2003 | Mishima et al. | |
| 6,660,153 B2 | 12/2003 | Merricks et al. | |
| 6,706,418 B2 | 3/2004 | Egli et al. | |
| 6,740,221 B2 | 5/2004 | Cheung et al. | |
| 6,747,217 B1 | 6/2004 | Jochym et al. | |
| 6,776,893 B1 | 8/2004 | Too et al. | |
| 6,793,796 B2 | 9/2004 | Reid et al. | |

(Continued)

OTHER PUBLICATIONS

International Search Report, PCT/US08/72136, dated Oct. 22, 2008, 3 pages.

(Continued)

*Primary Examiner*—Savitri Mulpuri
*Assistant Examiner*—Cheung Lee
(74) *Attorney, Agent, or Firm*—Senniger Powers LLP

(57) ABSTRACT

A method for metallizing a through silicon via feature in a semiconductor integrated circuit device substrate comprising immersing the semiconductor integrated circuit device substrate into an electrolytic copper deposition composition comprising a source of copper ions, an organic sulfonic acid or inorganic acid, or one or more organic compounds selected from among polarizers and/or depolarizers, and chloride ions.

21 Claims, 18 Drawing Sheets

U.S. PATENT DOCUMENTS

| | | |
|---|---|---|
| 6,797,142 B2 | 9/2004 | Crosby |
| 6,881,319 B2 | 4/2005 | Seita et al. |
| 6,924,551 B2 | 8/2005 | Rumer et al. |
| 6,926,922 B2 | 8/2005 | Leung et al. |
| 7,081,408 B2 | 7/2006 | Lane et al. |
| 7,105,082 B2 | 9/2006 | Hardikar |
| 7,111,149 B2 | 9/2006 | Eilert |
| 7,241,675 B2 | 7/2007 | Savastiouk et al. |
| 7,244,803 B2 | 7/2007 | Sezi et al. |
| 7,303,992 B2 | 12/2007 | Paneccasio et al. |
| 7,316,772 B2 | 1/2008 | Commander et al. |
| 7,317,256 B2 | 1/2008 | Williams et al. |
| 7,410,884 B2 | 8/2008 | Ramanathan et al. |
| 2002/0112964 A1 | 8/2002 | Gandikota et al. |
| 2004/0045832 A1 | 3/2004 | Martyak |
| 2004/0082756 A1* | 4/2004 | Sezi et al. .................. 528/363 |
| 2004/0154926 A1 | 8/2004 | Sun et al. |
| 2004/0217009 A1 | 11/2004 | Mikkola et al. |
| 2004/0222104 A1 | 11/2004 | Wang et al. |
| 2005/0045488 A1 | 3/2005 | Paneccasio et al. |
| 2005/0081744 A1 | 4/2005 | Klocke et al. |
| 2005/0199507 A1 | 9/2005 | Shih et al. |
| 2005/0211564 A1 | 9/2005 | Shih et al. |
| 2005/0241946 A1 | 11/2005 | Nagai et al. |
| 2005/0274622 A1 | 12/2005 | Sun et al. |
| 2006/0076661 A1 | 4/2006 | Savastiouk et al. |
| 2006/0264029 A1 | 11/2006 | Heck et al. |
| 2006/0278979 A1 | 12/2006 | Rangel |
| 2007/0001266 A1 | 1/2007 | Arana et al. |
| 2007/0085198 A1 | 4/2007 | Shi et al. |
| 2007/0235343 A1* | 10/2007 | Watkowski et al. ......... 205/291 |

OTHER PUBLICATIONS

Written Opinion, PCT/US08/72136, dated Oct. 22, 2008, 7 pages.

* cited by examiner

COPPER METALLIZATION OF THROUGH SILICON VIA

FIELD OF THE INVENTION

The present invention generally relates to a method and composition for filling through silicon via with copper metallization.

BACKGROUND OF THE INVENTION

The demand for semiconductor integrated circuit (IC) devices such as computer chips with high circuit speed and high circuit density requires the downward scaling of feature sizes in ultra-large scale integration (ULSI) and very-large scale integration (VLSI) structures. The trend to smaller device sizes and increased circuit density requires decreasing the dimensions of interconnect features and increasing their density. An interconnect feature is a feature such as a via or trench formed in a dielectric substrate which is then filled with metal, typically copper, to yield an electrically conductive interconnect. Copper, having better conductivity than any metal except silver, is the metal of choice since copper metallization allows for smaller features and uses less energy to pass electricity. In damascene processing, interconnect features of semiconductor IC devices are metallized using electrolytic copper deposition.

In the context of semiconductor integrated circuit device manufacture, substrates include patterned silicon wafers and dielectric films such as, for example, SiO2 or low-κ dielectrics. Low-κ dielectric refers to a material having a smaller dielectric constant than silicon dioxide (dielectric constant=3.9). Low-κ dielectric materials are desirable since such materials exhibit reduced parasitic capacitance compared to the same thickness of SiO2 dielectric, enabling increased feature density, faster switching speeds, and lower heat dissipation. Low-κ dielectric materials can be categorized by type (silicates, fluorosilicates and organo-silicates, organic polymeric etc.) and by deposition technique (CVD; spin-on). Dielectric constant reduction may be achieved by reducing polarizability, by reducing density, or by introducing porosity.

A patterned semiconductor integrated circuit device substrate, for example, a device wafer or die, may comprise both small and large interconnect features. Typically, a wafer has layers of integrated circuitry, e.g., processors, programmable devices, memory devices, and the like, built in a silicon substrate. Integrated circuit (IC) devices have been manufactured to contain small diameter vias and sub-micron sized trenches that form electrical connections between layers of interconnect structure. These features have dimensions on the order of about 150 nanometers or less, such as about 90 nanometers, 65 nanometers, or even 45 nanometers.

Plating chemistry sufficient to copper metallize small size via and trench features has been developed and finds use in the copper damascene method. Copper damascene metallization relies on superfilling additives, i.e., a combination of additives that are referred to in the art as accelerators, levelers, and suppressors. These additives act in conjunction in a manner that can flawlessly fill copper into the interconnect features (often called "superfilling" or "bottom up" growth). See, for example, Too et al., U.S. Pat. No. 6,776,893 and Commander et al., U.S. Pub. No. 2003/0168343, the disclosures of which are hereby incorporated as if set forth in their entireties.

Currently available electrolytic copper deposition systems that rely on superfilling additives can fill small size features at current densities as high as 6 A/dm$^2$ and in as little as 20 seconds, 10 seconds, or less.

In another form, a wafer may be constructed to comprise one or more large diameter vias. This type of via architecture is known in the art as a "through silicon via" (TSV). In some devices, through silicon via allows electrical interconnection between 2 or more wafers bonded to each other in a three-dimensional wafer stack. After being formed, the 3D wafer stack may be diced into stacked dies ("chips"), each stacked chip having multiple tiers ("layers") of integrated circuitry. Depending on where and when the vias are made, they can be characterized as "Via First—Before FEOL", or "Via First—After BEOL". In both cases, the vias are made before wafer/die attachment or bonding. The third category of TSV is via last, which means the via is constructed after wafer/die attachment or bonding.

Through silicon vias are critical components of three-dimensional integrated circuits, and they can be found in RF devices, MEMs, CMOS image sensors, Flash, DRAM, SRAM memories, analog devices, and logic devices.

The depth of a TSV depends on the via type (via first or via last), and the application. Via depth varies from 20 microns to 500 microns, typically between about 50 microns and about 250 microns. Via openings in TSV have an entry dimension such as a diameter on the order of between about 200 nm to about 200 microns, typically between about 25 microns and about 75 microns. The typical aspect ratio for a through silicon via is from 0.3:1 to greater than 20:1.

Filling large size through silicon via in commercially practicable durations is a barrier to the commercial feasibility of devices employing TSV. Experimental data obtained to date suggests that conventional electrolytic copper deposition methods employing compositions appropriate for damascene metallization (i.e., the composition comprises the three component superfilling additives including accelerator, suppressor, and leveler) are current density limited (such as about 0.10 A/dm$^2$ or less to get defect-free fill) and may require plating durations as long as 20 hours to completely metallize large dimension (e.g., greater than 50 micron diameter openings) through silicon via.

Available prior art in the field of through silicon via filling has not, to date, suggested methods and compositions capable of rapidly filling through silicon via in a commercially practicable deposition period.

For example, Arana et al. (U.S. 2007/0001266, Intel Corporation) disclose a method for filling through silicon via by incorporating particles into the copper metallization, the particles having a different coefficient of thermal expansion than the copper matrix. The stated purpose is to reduce stress variations between the copper metallization matrix and the silicon possibly caused by the differing bulk CTE of the respective materials. Notably, the reference does not include actual electrolytic copper plating chemistry, nor does the reference state that their electrolytic plating method incorporating particles in the deposition composition reduces through silicon via fill time.

Lane et al. (U.S. Pat. No. 7,081,408, Intel Corporation) disclose a method for filling through silicon via features. Although they discuss filling the through silicon via with copper metallization by any suitable process, for example, electrolytic deposition, Lane et al. do not disclose actual electrolytic copper plating chemistry, nor do they disclose the duration necessary to achieve copper filling.

Copper plating is also known from, e.g., also Eilert (U.S. Pat. No. 7,111,149); Rumer et al. (U.S. Pat. No. 6,924,551);

Shi et al. (U.S. Pub. No. 2007/0085198); Ramanathan et al. (U.S. Pub. No. 2007/0117348) Heck et al. (U.S. Pub. No. 2006/0264029); Williams et al. (U.S. Pub. No. 2006/0273455); Rangel (U.S. Pub. No. 2006/0278979); and Savastiouk et al. (U.S. Pub. No. 2005/0136635); but none of these references, which relate to through silicon via architectures and methods, disclose applicable copper metallization chemistries or plating durations sufficient to fill through silicon via features.

Given the current state of the art, it is apparent that there is a distinct need for applicable methods and compositions sufficient to copper metallization through silicon via features in a commercially practicable manner.

SUMMARY OF THE INVENTION

Briefly, therefore, the present invention is directed to a method for metallizing a through silicon via feature in a semiconductor integrated circuit device substrate, wherein the semiconductor integrated circuit device substrate comprises a front surface, a back surface, and the via feature and wherein the via feature comprises an opening in the front surface of the substrate, a sidewall extending from the front surface of the substrate, and a bottom, the method comprising immersing the semiconductor integrated circuit device substrate into an electrolytic copper deposition composition, wherein the through silicon via feature has an entry dimension between about 200 nm and about 200 microns, and an aspect ratio greater than about 0.3:1, the deposition composition comprising (a) a source of copper ions; (b) an organic sulfonic acid; (c) one or more organic compounds selected from among polarizers and/or depolarizers; and (d) chloride ions; and supplying electrical current to the electrolytic deposition composition to deposit copper metal onto the bottom and sidewall for bottom-up filling to thereby yield a copper filled via feature.

Other objects and features will be in part apparent and in part pointed out hereinafter.

DETAILED DESCRIPTION OF THE EMBODIMENT(S) OF THE INVENTION

The present invention is directed to a method for electrolytically depositing copper metal into large size TSV features located in semiconductor integrated circuit device substrates. These features have a depth from less than about 20 to about 750 microns, typically between about 20 and about 500 microns, such as between about 50 and 250 or 300 microns. They have an entry dimension (such as diameter where the entry is round) on the order of between about 200 nm and about 500 microns, typically between about 5 and about 300 microns, such as between about 5 or 10 and about 100 microns, with aspect ratios greater than 0.3:1, such as between about 0.3:1 to greater than about 20:1, such as between about 4:1 and about 15:1.

Figure 1:
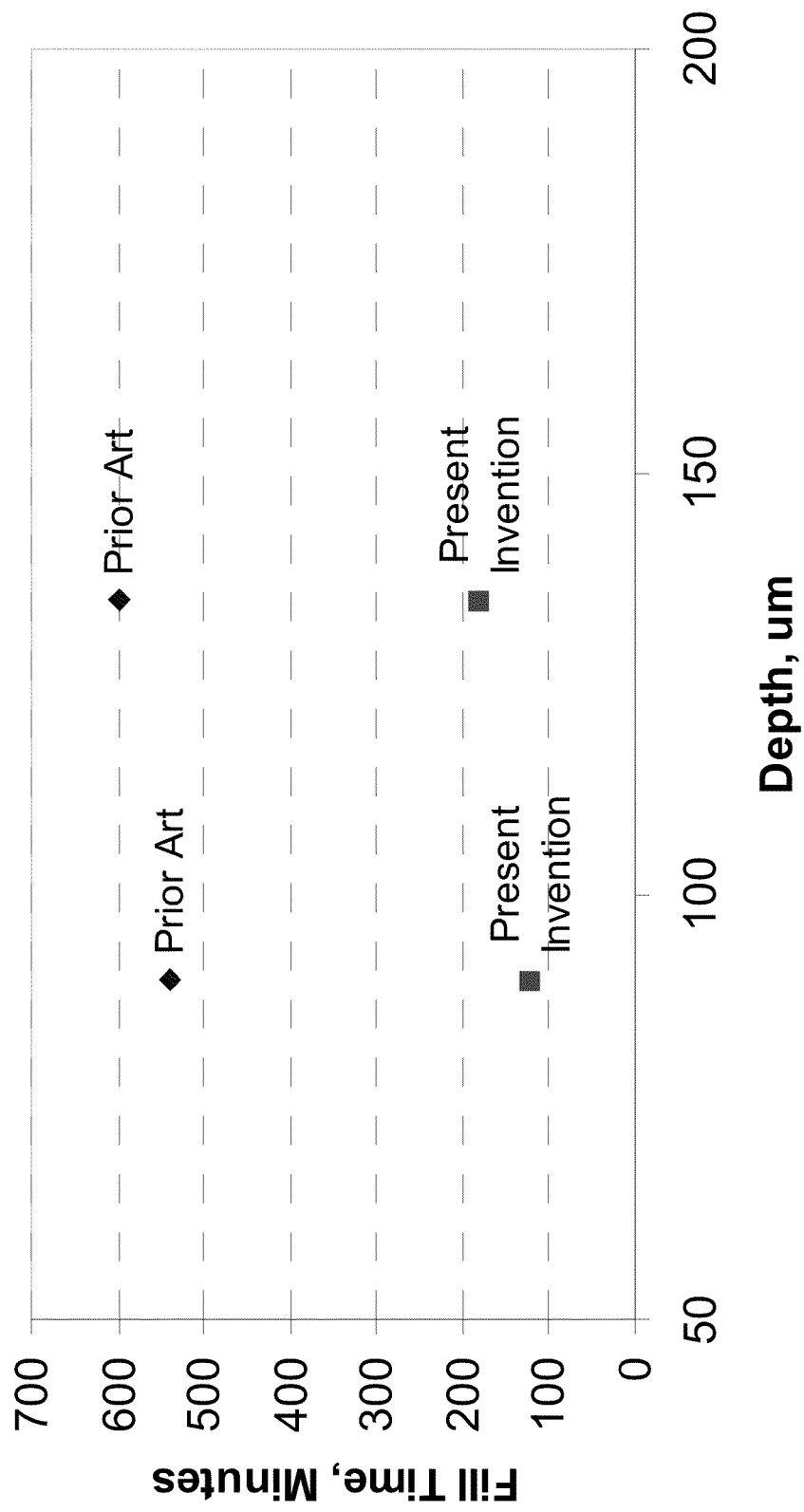
FIG. 1 is a graph demonstrating relative rate enhancement results from present invention compared to prior art with the same through silicon via structures and same plating equipment.

Advantageously, the method of the present invention achieves defect-free (i.e., void free and seam free) fill at higher current densities than the limited current densities required when using conventional electrolytic deposition chemistries appropriate for damascene metallization, i.e., electrolytic deposition compositions that employ the conventional three component additive system (accelerator, suppressor, and leveler). As such, the total time to copper metallize a through silicon via (i.e., at least about 90% of the volume of the TSV, preferably at least about 99% of the volume, even more preferably complete fill) is greatly reduced by the method of the present invention. The interaction among the copper ions, the acid, the halide, the polarizers and the depolarizers as described hereinbelow enables an up to five times increase of the copper via fill speed compared to prior art—as shown in FIG. 1—while fulfilling defect-free, low overburden, and bottom up fill requirements. FIG. 1 demonstrates that the fill time for a 90-micron depth with the present invention is about 110 minutes while the fill time for the prior art is greater than 500 minutes. And for about a 135-micron depth, the fill time with the present invention is about 190 minutes compared to 600 minutes for the prior art.

The electrolytic copper deposition composition of the present invention comprises a source of copper ions, an acid, one or more components that enhances the rate of copper deposition, one or more components that suppress the rate of copper deposition with halide ions such as chloride. Combination of said components in the appropriate concentration ratios which are compatible and under the appropriate operating conditions (e.g. temperature, flow rate/agitation, current density and waveforms such as direct current and/or pulse, pulse reverse, etc.) facilitates selective bottom up filling of features as described in the aforementioned introduction.

Conformal plating is characterized by a deposit of equal thickness at all points of a feature and may lead to formation of a seam if is used to fill the via completely. Conformal plating results from relatively equal copper deposition suppression along the side walls and via bottom, resulting in a relatively equal rate of copper deposition on both the sidewalls and the bottom of the through silicon via. Copper growth along the sidewalls converges at some point toward the center of the via, forming a seam. Sub-conformal plating is characterized by overgrowth at the top of the feature and may lead to the formation of a void. Sub-conformal plating results when local depletion of copper ion inside the feature causes a concentration overpotential which causes the current to flow preferentially to more accessible locations near the top of and outside the feature. Local depletion of copper ions is thought to occur, in part, due to inadequate mass transfer of copper ions to the bottom of the feature.

To achieve defect-free filling, i.e., void-free and seam-free, the deposition rate in the bottom should exceed the deposition rate on the side walls. For example, during copper metallization of a relatively large size feature having an opening diameter of about 50 microns and sidewalls depth of about 200 microns, current experiments to date suggest that the copper deposition rate along of the bottom (i.e., bottom up or vertical growth rate) is much faster than the copper deposition rate along the sidewalls (i.e. lateral or horizontal growth rate).

Figure 2:
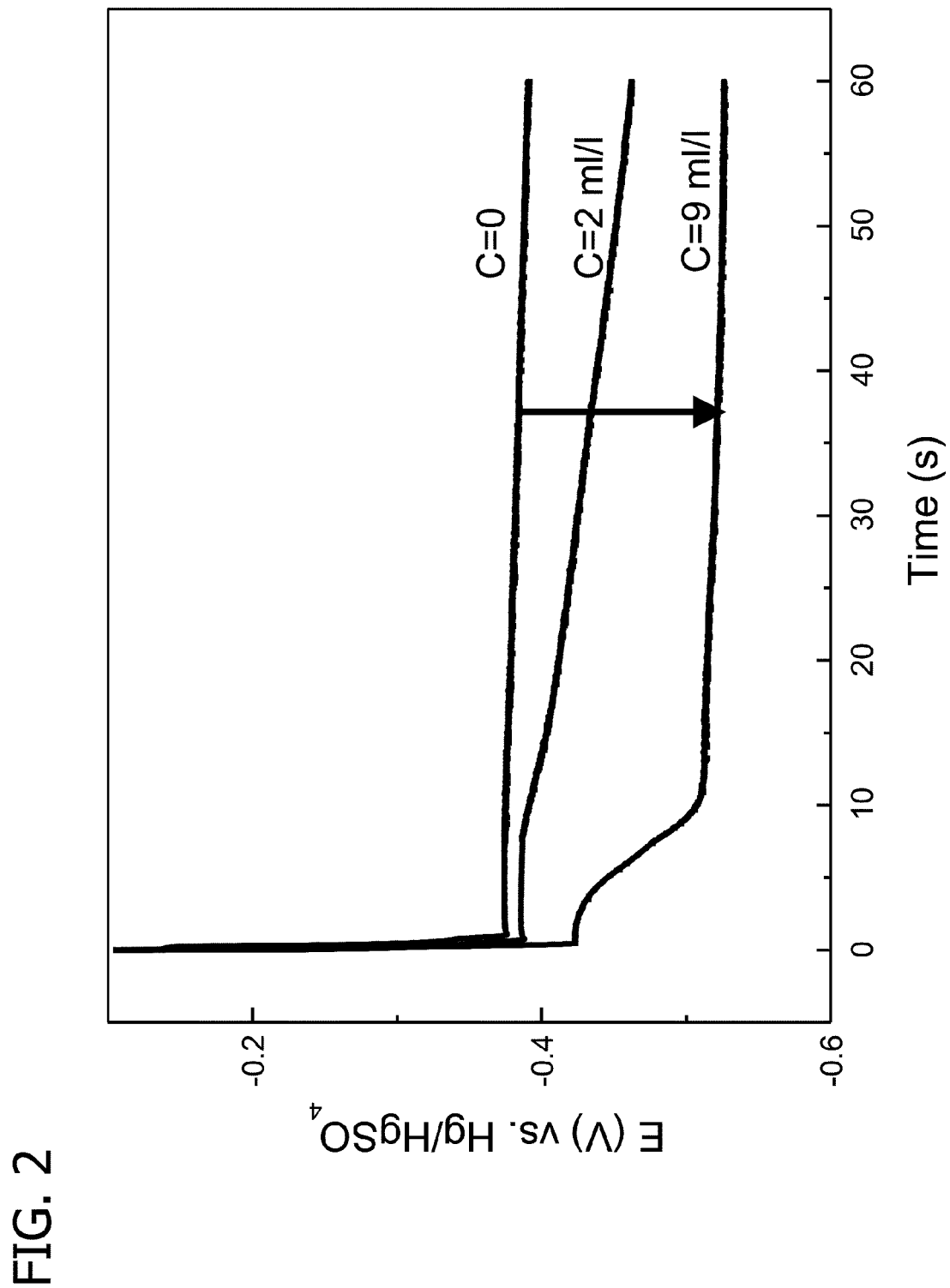
FIG. 2 is a graph of potential v. time response in a controlled current experiment demonstrating the polarizing effect of a polarizer.

In the present invention, bottom up TSV filling appears to result from use of polarizers and/or depolarizers to promote a situation where copper deposition potential is less negative in the bottom of the via than it is at the top of the feature at the via opening. Polarizers are defined herein as organic molecules that result in a negative shift of the copper deposition potential, as shown in FIG. 2. In particular, FIG. 2 shows four potential (E) vs. time (t) response curves. The top first curve is the E/t response without the polarizer. The two lower curves are the E/t responses in the presence of polarizer, C, at concentrations of 2 and 9 ml/L. As is clearly shown by the arrow, the potentials become more negative in the presence of C than that without C. In addition, at higher C concentrations such as 9 ml/L, the negative shift of the potential is larger than that of 2 ml/L C. This polarizing phenomenon is also called "suppressing" and the molecules that show this behavior may be called "suppressors" or "levelers."

Figure 3:
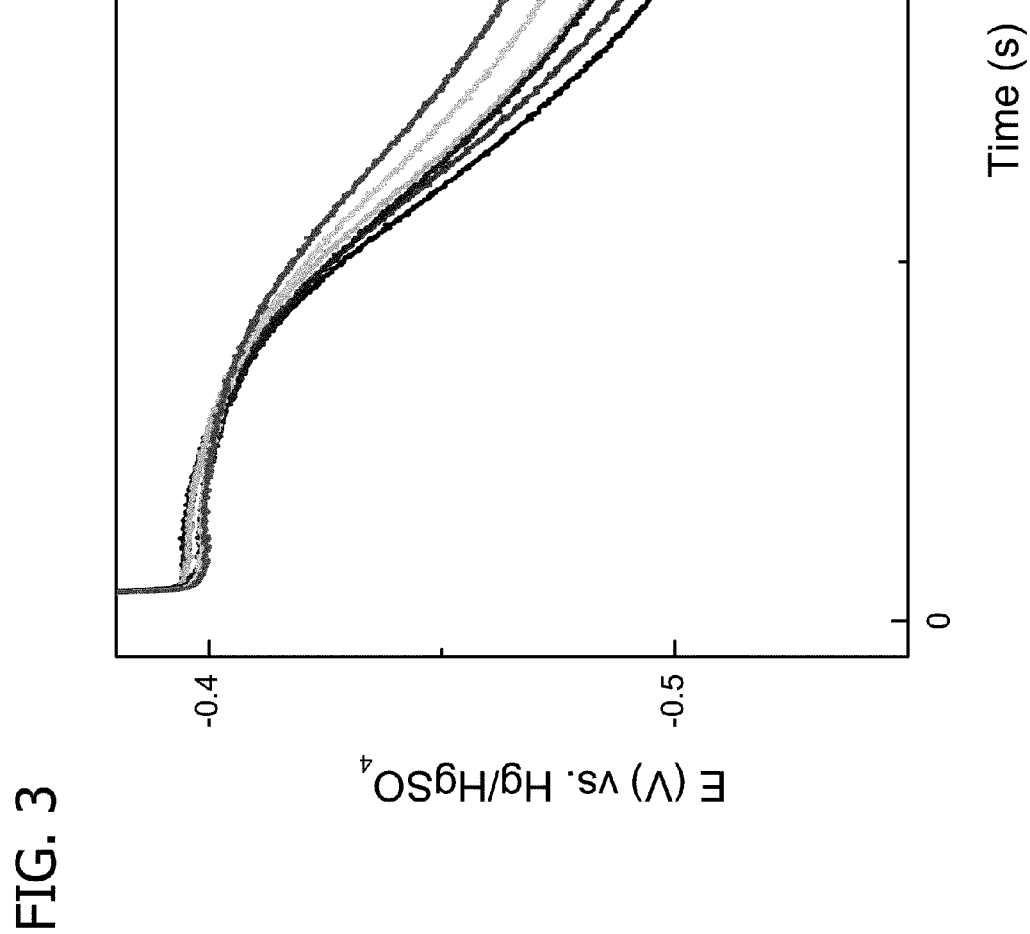
FIG. 3 is a graph of potential v. time response in a controlled current experiment demonstrating the depolarizing effect of a depolarizer.

Depolarizers are defined herein as molecules that result in a shift in positive direction of the copper deposition potential, as shown in FIG. 3. In particular, FIG. 3 shows six potential vs time response curves. The bottom first curve is the E/t response without the depolarizer, B. The five upper curves are the E/t responses in the presence of the depolarizer B, at concentrations of 2, 4, 5.5, 8 and 10 ml/L, respectively. As can be seen clearly by the arrow, the potentials become more positive (less negative in absolute value) in the presence of B than that without B. In addition, at higher concentrations of B such as 5.5 and 10 ml/L, the positive shift of the potential is larger than that of 2 ml/L B. This depolarizing phenomenon is also called "accelerating" and the molecules that show this behavior are called "accelerators" or "brighteners." Prior art suggests that in order to fulfill bottom up fill, at least a two component system consisting an accelerator and a suppressor would have to be employed, in some cases, a three component system consisting an accelerator, a suppressor and a leveler would have to be employed. The present invention demonstrates that for TSV applications it is the electrochemical signature shown in FIG. 4 that is instrumental in bottom up, complete, and defect-free fill, not necessarily how many organic components are in the chemistry. The below working examples include specific examples of using one, two, three and four organic components to achieve the bottom up fill objective.

Figure 4:
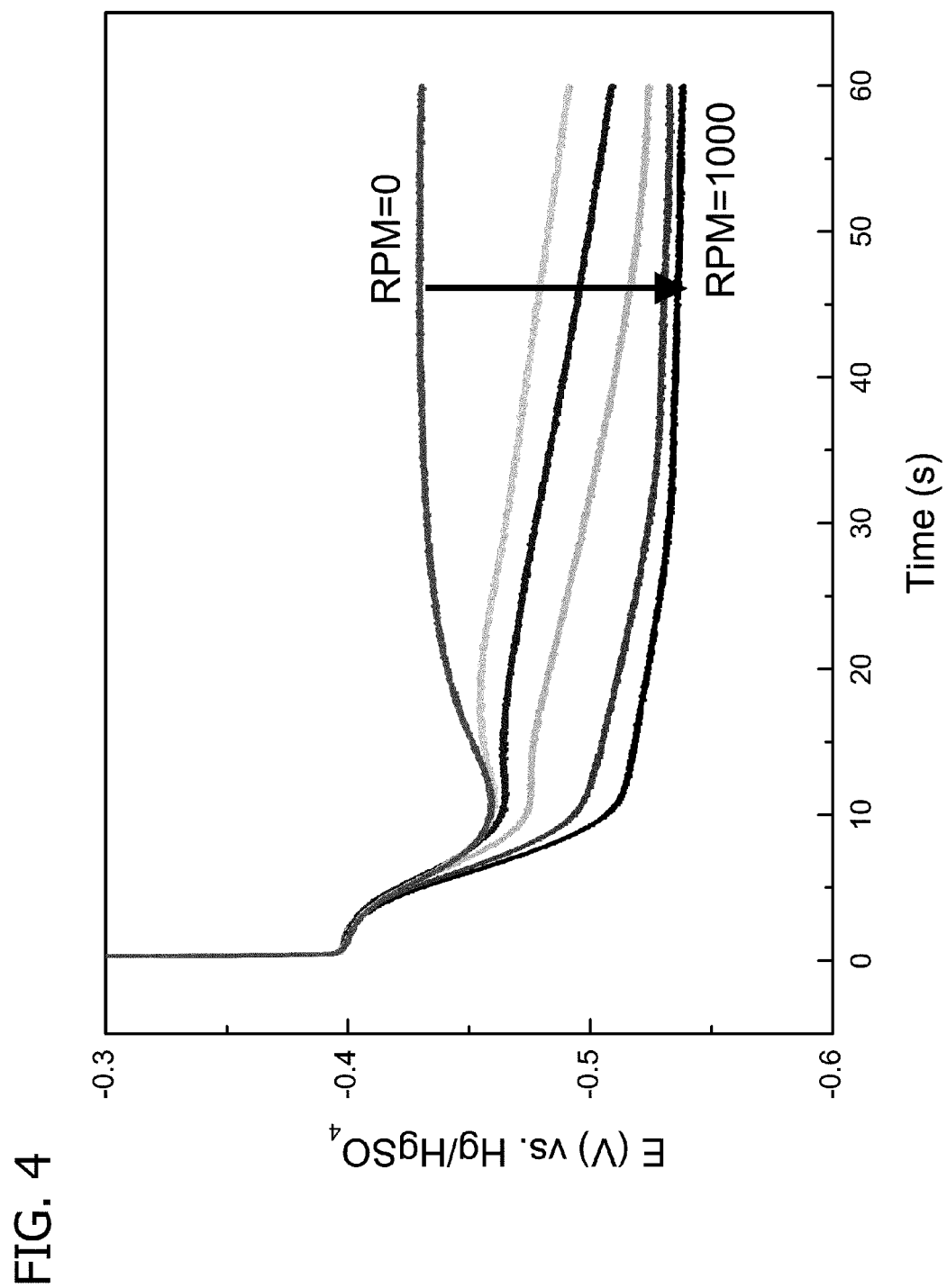
FIG. 4 is a graph of potential v. time response in a controlled current experiment demonstrating the synergistic effect between a polarizer and a depolarizer.
Figure 5:
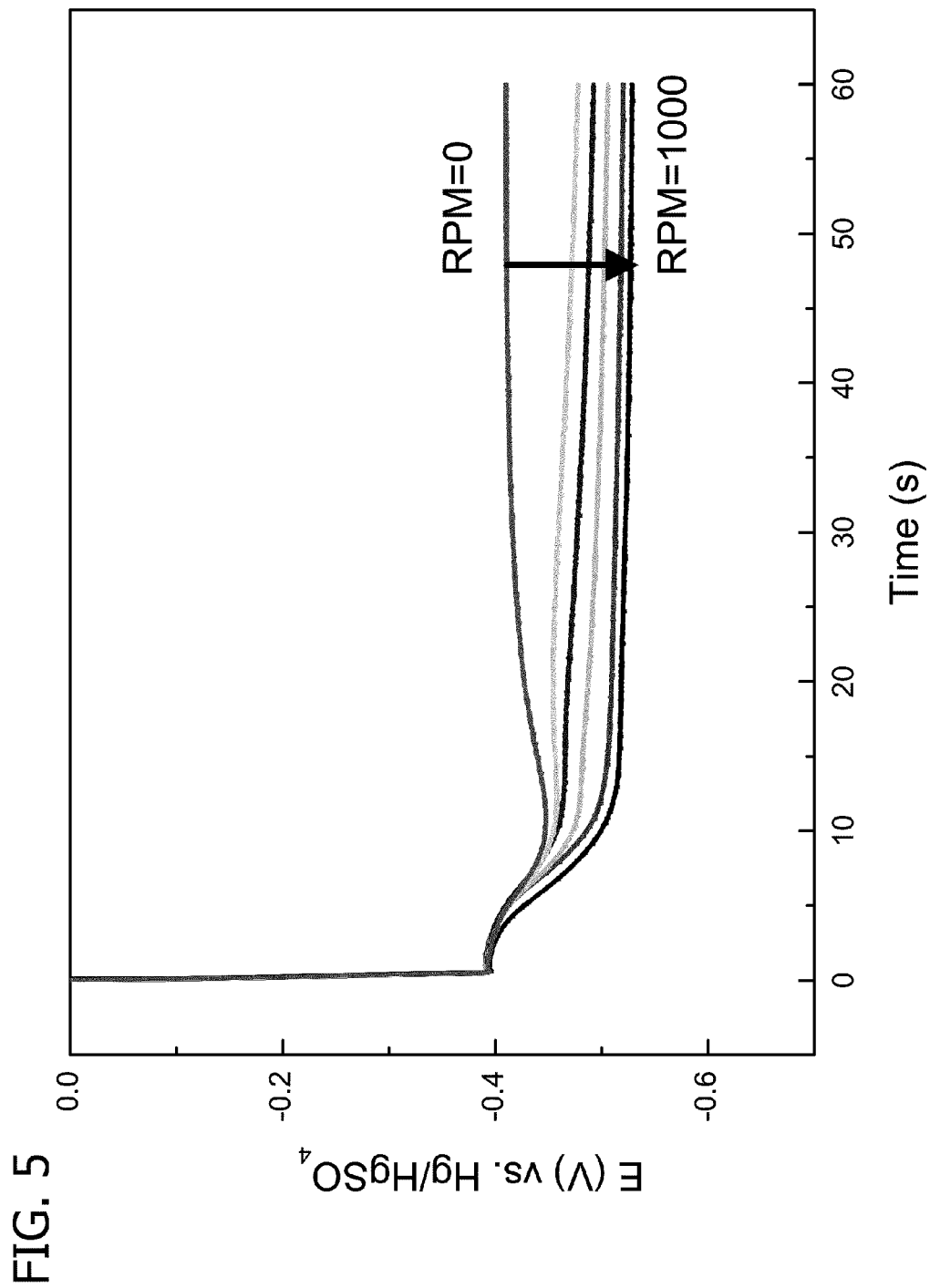
FIG. 5 is a graph of potential v. time response in a controlled current experiment showing bottom-up fill behavior in a system having just one organic component.

The efficacy of this invention is understood with reference to FIG. 4. The experiment is conducted with a rotating disk electrode. In this experiment, the current density is kept at 1 $A/dm^2$, while the electrode is rotating at different rounds per minute (RPM). The purpose of rotating the electrode is to provide solution agitation or solution movement or mass transport. When RPM=0, it means that there is no solution movement, which represents the solution movement (or lack of) at the bottom of the via. When RPM=1000, it means that there is a strong solution movement, which represents the solution movement at the top surface. Moving downwardly, the upper curve is RPM=0, then 50, 100, 200, 500, and 1000 (bottom curve). This figure is therefore a simulation of differences in copper deposition potential which can be achieved at a via bottom versus at a via opening. As it is shown, the copper reduction potential is much less negative (more positive) at 0 RPM than at 1000 RPM, which means that the copper deposition rate is much faster at the via bottom than at the via top (or opening). In another words, the copper deposition at the via bottom is "accelerated" compared to the copper deposition at the top. In general, greater separation between the potential at 0 and 1000 RPM corresponds to a more advantageous bias towards bottom up via filling. However, it is important to point out that depending on the via dimension (diameter and aspect ratio), the difference in potential between the bottom and the top via would be different. Therefore, one must select the right organic components (in chemical nature and in numbers) to fulfill defect-free bottom up fill. For instance, when filling a relatively large via (such as 100 microns diameter, 200 microns depth), one could select a one-component system which gives a potential difference between the bottom and the top of the via of about 50 mV. Whereas when filling smaller vias (such as 25, 35 and 50 microns diameters and 175 microns deep), one could select a two-component system which gives a potential difference between the bottom and the top of the via of about 100 mV, FIG. 4. Accordingly, in one aspect the invention involves use of one or more polarization compounds selected from among polarizers and depolarizers, which one or more polarization compounds promotes a copper deposition potential at the via bottom which is at least about 50 millivolts, for example at least about 100 millivolts, less negative than a copper deposition potential at the via opening.

In a preferred embodiment, a depolarizer that enhances the rate of copper deposition is an organic sulfur compound. Organic sulfur compounds currently preferred by the applicants are water soluble organic divalent sulfur compounds. In one preferred embodiment, the organic sulfur compound has the following general structure (1):

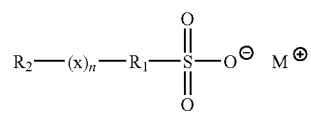

Structure (1)

wherein
X is O, S, or S=O;
n is 1 to 6;
M is hydrogen, alkali metal, or ammonium as needed to satisfy the valence;
R1 is an alkylene or cyclic alkylene group of 1 to 8 carbon atoms, an aromatic hydrocarbon or an aliphatic aromatic hydrocarbon of 6 to 12 carbon atoms; and
R2 is hydrogen, hydroxyalkyl having from 1 to 8 carbon atoms, or MO3SR1 wherein M and R1 are as defined above.

Preferred organic sulfur compounds of Structure (1) have the following structure (2):

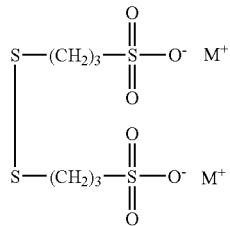

Structure (2)

wherein M is a counter ion possessing charge sufficient to balance the negative charges on the oxygen atoms. M may be, for example, protons, alkali metal ions such as sodium and potassium, or another charge balancing cation such as ammonium or a quaternary amine.

One example of the organic sulfur compound of structure (2) is the sodium salt of 3,3'-dithiobis(1-propanesulfonate), which has the following structure (3):

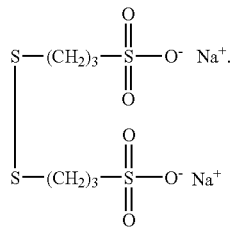

Structure (3)

An especially preferred example of the organic sulfur compound of structure (2) is 3,3'-dithiobis(1-propanesulfonic acid), which has the following structure (4):

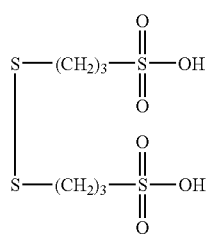

Structure (4)

Additional organic sulfur compounds that are applicable are shown by structures (5) through (16):

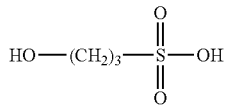

Structure (5)

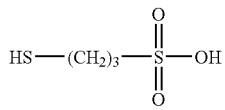

Structure (6)

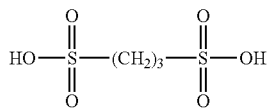

Structure (7)

Structure (8)

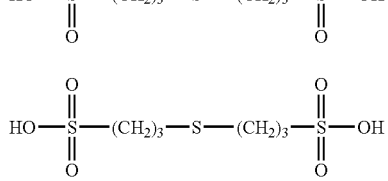

Structure (9)

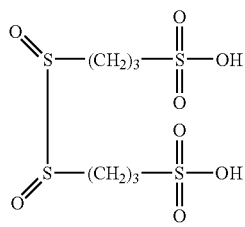

Structure (10)

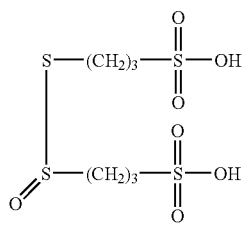

Structure (11)

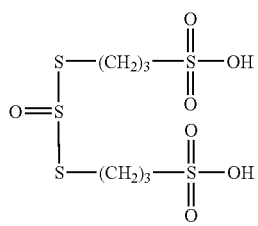

Structure (12a)

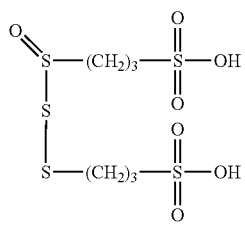

Structure (12b)

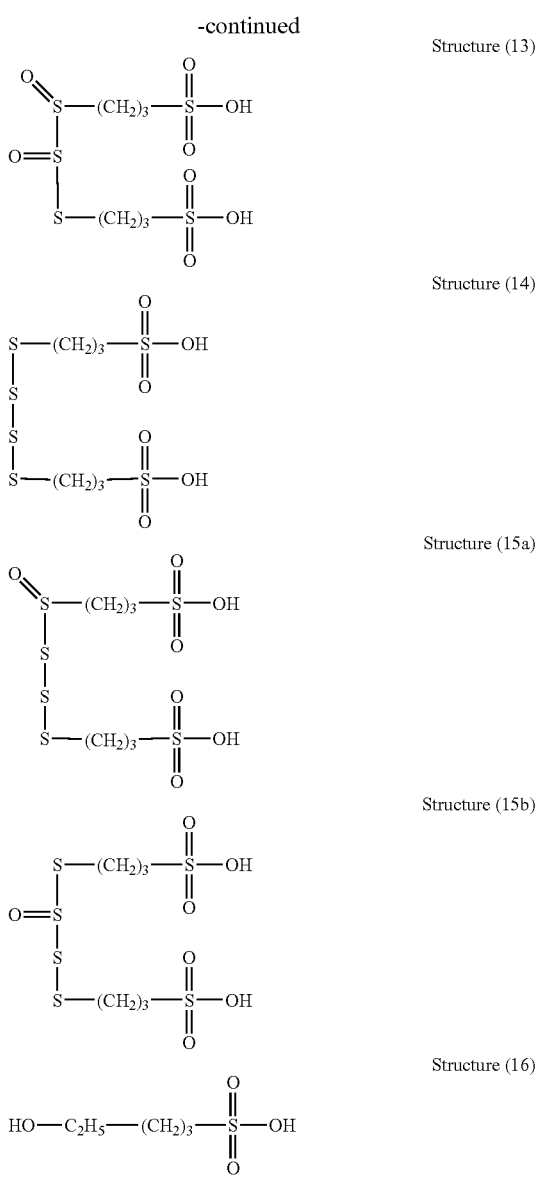

Structure (13)

Structure (14)

Structure (15a)

Structure (15b)

Structure (16)

The organic sulfur compound may be added in a concentration between about 1 PPM and about 2 PPM typically between about 3 PPM and about 100 PPM, such as between about 5 PPM and 50 PPM. In a preferred embodiment, the organic sulfur compound is 3,3'-dithiobis(1-propanesulfonic acid) added in a concentration of about 20 PPM, which is between about 10 PPM and about 30 PPM.

The electrolytic copper deposition composition comprises a component that polarizes the potential of copper deposition and yields a slower copper deposition rate near the opening of a through silicon via feature. An exemplary group of compounds observed to have a polarizing effect include vinyl-pyridine based compounds. In one embodiment, the compound is a pyridinium compound and, in particular, a quaternized pyridinium salt. A pyridinium compound is a compound derived from pyridine in which the nitrogen atom of the pyridine is protonated. A quaternized pyridinium salt is distinct from pyridine, and quaternized pyridinium salt-based polymers are distinct from pyridine-based polymers, in that the nitrogen atom of the pyridine ring is quaternized in the quaternized pyridinium salt and quaternized pyridinium salt-based polymers. The suppressive compounds of the invention include derivatives of a vinyl pyridine, such as derivatives of 2-vinyl pyridine and, in certain preferred embodiments, derivatives of 4-vinyl pyridine. The suppressive compound polymers of the invention encompass homo-polymers of vinyl pyridine, co-polymers of vinyl pyridine, quaternized salts of vinyl pyridine, and quaternized salts of these homo-polymers and co-polymers. Some specific examples of such compounds include, for example, poly(4-vinyl pyridine), the reaction product of poly(4-vinyl pyridine) with dimethyl sulfate, the reaction product of 4-vinyl pyridine with 2-chloro-ethanol, the reaction product of 4-vinyl pyridine with benzyl-chloride, the reaction product of 4-vinyl pyridine with allyl chloride, the reaction product of 4-vinyl pyridine with 4-chloromethylpyridine, the reaction product of 4-vinyl pyridine with 1,3-propane sultone, the reaction product of 4-vinyl pyridine with methyl tosylate, the reaction product of 4-vinyl pyridine with chloroacetone, the reaction product of 4-vinyl pyridine with 2-methoxyethoxymethylchloride, the reaction product of 4-vinyl pyridine with 2-chloroethylether, the reaction product of 2-vinyl pyridine with methyl tosylate, the reaction product of 2-vinyl pyridine with dimethyl sulfate, the reaction product of vinyl pyridine and a water soluble initiator, poly(2-methyl-5-vinyl pyridine), and 1-methyl-4-vinylpyridinium trifluoromethyl sulfonate, among others. An example of a co-polymer is vinyl pyridine co-polymerized with vinyl imidazole.

The molecular weight of the substituted pyridyl polymer compound additives of the invention in one embodiment is on the order of about 160,000 g/mol or less. While some higher molecular weight compounds are difficult to dissolve into the electroplating bath or to maintain in solution, other higher molecular weight compounds are soluble due to the added solubilizing ability of the quaternary nitrogen cation. The concept of solubility in this context is reference to relative solubility, such as, for example, greater than 60% soluble, or some other minimum solubility that is effective under the circumstances. It is not a reference to absolute solubility. The foregoing preference of 160,000 g/mol or less in certain embodiments is not narrowly critical. In one embodiment, the molecular weight of the substituted pyridyl polymer compound additive is about 150,000 g/mol, or less. Preferably, the molecular weight of the substituted pyridyl polymer compound additive is at least about 500 g/mol. Accordingly, the molecular weight of the substituted pyridyl polymer compound additive may be between about 500 g/mol and about 150,000 g/mol, such as about 700 g/mol, about 1000 g/mol, and about 10,000 g/mol. The substituted pyridyl polymers selected are soluble in a Cu plating bath, retain their functionality under electrolytic conditions, and do not yield deleterious by-products under electrolytic conditions, at least neither immediately nor shortly thereafter.

In those embodiments where the compound is a reaction product of a vinyl pyridine or poly(vinyl pyridine), it is obtained by causing a vinyl pyridine or poly(vinyl pyridine) to react with an alkylating agent selected from among those which yield a product which is soluble, bath compatible, and effective for leveling. In one embodiment candidates are selected from among reaction products obtained by causing vinyl pyridine or poly(vinyl pyridine) to react with a compound of the following structure (17)

R1-L                                (17)

wherein R1 is alkyl, alkenyl, aralkyl, heteroarylalkyl, substituted alkyl, substituted alkenyl, substituted aralkyl, or substituted heteroarylalkyl; and L is a leaving group.

A leaving group is any group that can be displaced from a carbon atom. In general, weak bases are good leaving groups. Exemplary leaving groups are halides, methyl sulfate, tosylates, and the like.

In another embodiment, R1 is alkyl or substituted alkyl; preferably, R1 is substituted or unsubstituted methyl, ethyl, straight, branched or cyclic propyl, butyl, pentyl or hexyl; in one embodiment R1 is methyl, hydroxyethyl, acetylmethyl, chloroethoxyethyl or methoxyethoxymethyl.

In a further embodiment, R1 is alkenyl; preferably, R1 is vinyl, propenyl, straight or branched butenyl, straight, branched or cyclic pentenyl or straight, branched, or cyclic hexenyl; in one embodiment R1 is propenyl.

In yet another embodiment, R1 is aralkyl or substituted aralkyl; preferably, R1 is benzyl or substituted benzyl, naphthylalkyl or substituted naphthylalkyl; in one embodiment R1 is benzyl or naphthylmethyl.

In still another embodiment, R1 is heteroarylalkyl or substituted heteroarylalkyl; preferably, R1 is pyridylalkyl; particularly, R1 is pyridylmethyl.

In a further embodiment, L is chloride, methyl sulfate ($CH_3SO_4$—), octyl sulfate ($C_8H_{18}SO_4$—), trifluoromethanesulfonate ($CF_3SO_3$—), chloroacetate ($CH_2ClC(O)O$—), or tosylate ($C_7H_7SO_3$—); preferably, L is methyl sulfate, chloride or tosylate.

Water soluble initiators can be used to prepare polymers of vinyl pyridine, though they are not used in the currently preferred embodiments or in the working examples. Exemplary water soluble initiators are peroxides (e.g., hydrogen peroxide, benzoyl peroxide, peroxybenzoic acid, etc.) and the like, and water soluble azo initiators such as 4,4'-Azobis(4-cyanovaleric acid).

In a further embodiment, the compound constitutes a component of a mixture of one of the above-described polymers with a quantity of a monomer which is, for example, a monomeric vinyl pyridine derivative compound. In one such embodiment, the mixture is obtained by quaternizing a monomer to yield a quaternized salt which then undergoes spontaneous polymerization. The quaternized salt does not completely polymerize; rather, it yields a mixture of the monomer and spontaneously generated polymer.

In a currently preferred embodiment, 4-vinyl pyridine is quaternized by reaction with dimethyl sulfate, and spontaneous polymerization occurs according to the following reaction scheme (45-65° C.):

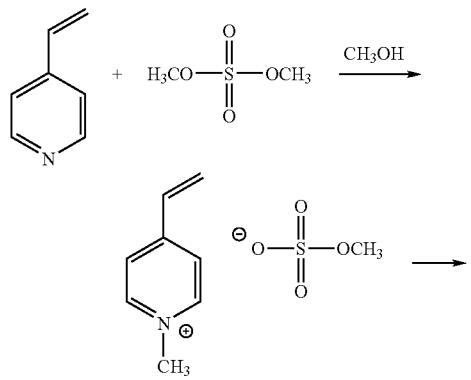

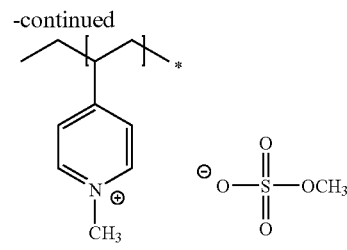

(MW < 10,000)

The monomer fraction is increased with an increase in amount of methanol used in the quaternization reaction; that is, the degree of spontaneous polymerization is decreased.

The component that polarizes the copper deposition and renders a slower copper deposition rate near the opening of a via feature may be incorporated into the electroplating bath at concentrations between about 1 ppm and about 200 ppm. In one embodiment, the component that suppresses the rate of copper deposition near the opening of a via feature may be added to the electrolytic copper deposition composition at concentrations between about 1 and about 40 ppm or higher, preferably between about 2 ppm and about 20 ppm. Experiments to date indicate that the concentration of the component is optimally determined in view of the aspect ratio of the feature to be copper metallized. For example, in embodiments wherein the feature has a relatively low aspect ratio, such as about 3:1, about 2.5:1, or about 2:1 (depth:opening diameter), or less, the concentration of the component is preferably near the lower end of the preferred range, such as between about 4.2 ppm and about 8.4 ppm (0.45 micromolar), such as about 5.6 ppm. In embodiments wherein the feature has a relatively high aspect ratio, such as about 4:1, about 5:1, or about 6:1 (depth:opening diameter), or more, the concentration of the component is preferably near the higher end of the preferred range, such as between about 9.8 ppm and about 14 ppm, such as about 11.2 ppm. Without being bound by a particular theory, it is thought that relatively higher concentrations are preferred for higher aspect ratios since this advantageously establishes a concentration gradient difference along the via wall, which concentration gradient acts to inhibit void formation. With regard to lower aspect ratios, the leveler concentration is preferably maintained near the lower end of the preferred range to avoid unnecessarily prolonging the fill time.

Alternative depolarizers applicable for use in this invention include polypropylene glycol amine (PPGA), in particular, poly(propylene glycol)bis(2-aminopropyl ether)(400 g/mol) and low molecular weight polypropylene glycol (PPG). When employed, these are added in a concentration between about 5 ppm and about 60 ppm, typically between about 15 ppm and about 30 ppm.

A wide variety of electrolytic copper deposition compositions are potentially applicable. The electrolytic baths include acid baths including mixed organic acid baths and alkaline baths. Exemplary electrolytic copper plating baths include copper fluoroborate, copper pyrophosphate, copper phosphonate, copper sulfate, and other copper metal complexes such as copper methane sulfonate. Preferred copper sources include copper sulfate in sulfuric acid solution and copper methane sulfonate in methane sulfonic acid solution.

In certain preferred embodiments, the copper source is copper methanesulfonate and the acid is methanesulfonic acid. The use of copper methanesulfonate as the copper source allows for greater concentrations of copper ions in the electrolytic copper deposition composition in comparison to other copper ion sources. Accordingly, the source of copper ion may be added to achieve copper ion concentrations greater than about 50 g/L, greater than about 90 g/L, or even greater than about 100 g/L, such as, for example about 110 g/L. Preferably, the copper methane sulfonate is added to achieve a copper ion concentration between about 70 g/L and about 100 g/L. High copper concentrations in the bulk solution contribute to a steep copper concentration gradient that enhances diffusion of copper into the features. Experimental evidence to date indicates that the copper concentration is optimally determined in view of the aspect ratio of the feature to be copper metallized. For example, in embodiments wherein the feature has a relatively low aspect ratio, such as about 3:1, about 2.5:1, or about 2:1 (depth:opening diameter), or less, the concentration of the copper ion is added and maintained at the higher end of the preferred concentration range, such as between about 90 g/L and about 110 g/L, such as about 110 g/L. In embodiments wherein the feature has a relatively high aspect ratio, such as about 4:1, about 5:1, or about 6:1 (depth:opening diameter), or more, the concentration of the copper ion may be added and maintained at the lower end of the preferred concentration range, such as between about 80 g/L and about 100 g/L, such as about 90 g/L. Without being bound to a particular theory, it is thought that higher concentrations of copper ion for use in metallizing high aspect ratio features may increase the possibility of necking (which may cause voids). Accordingly, in embodiments wherein the feature has a relatively high aspect ratio, the concentration of the copper ion is optimally decreased. Similarly, the copper concentration may be increased in embodiments wherein the feature a relatively low aspect ratio.

Figure 6:
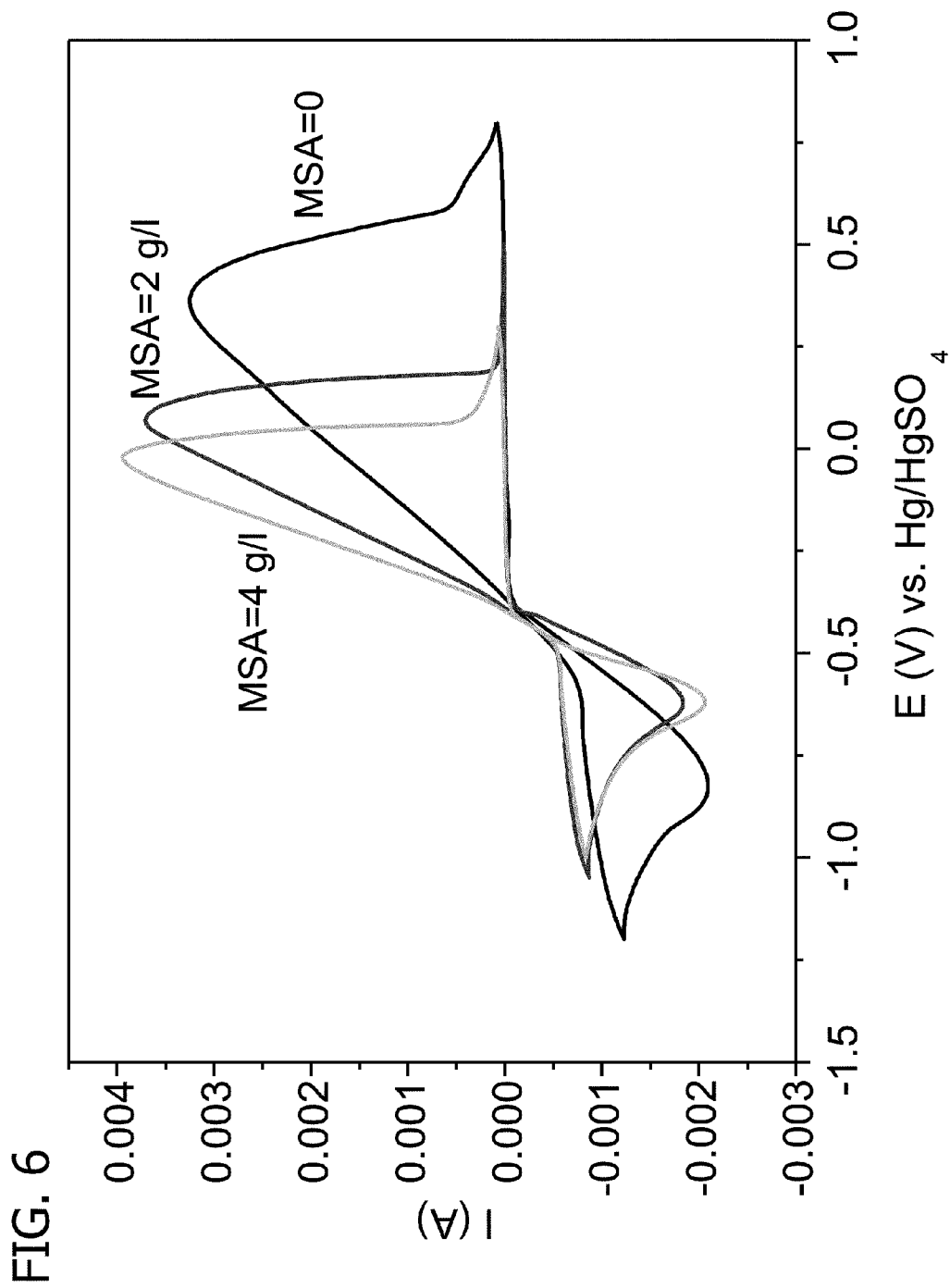
FIG. 6 is a graph of current-potential response obtained in a cyclic voltammetrical experiment with a fixed scan rate of 50 mV/s.

When copper methane sulfonate is used, it is preferred to use methane sulfonic acid and its derivative and other organic sulfonic acids as the electrolyte. When methane sulfonic acid is added, its concentration may be between about 1 g/L and about 50 g/L, such as between about 5 g/L and about 25 g/L, such as about 20 g/L. Experimental evidence to date indicates that increased acidity advantageously plays a role in the copper metallization process. As an example, it has been discovered that incorporating methane sulfonic acid in the electrolytic copper deposition composition reduces the electrochemical copper reduction potential (i.e., makes it less negative, thereby facilitating Cu deposition, as shown in FIG. 6. FIG. 6 shows three current-potential curves from cyclic voltammetric experiments, with MSA concentrations of 0, 2 g/L, and 4 g/L. In this experiment, both copper reduction and oxidation information were obtained. It is important to distinguish the anodic current and cathodic current. In plating terminology, when the current is positive (I>0), it is called anodic current; when the current is negative (I<0), it is called cathodic current or reduction current. Attention is paid to the cathodic behavior or reduction of Cu(II) to Cu metal (lower left curves). As it is shown clearly in FIG. 6, the addition of methane sulfonic acid in the amount of 2 and 4 g/L, resulted in a potential shift towards more positive direction, which in turn results in faster rate of Cu deposition. However there is an optimum window of free methane sulfonic acid in which defect-free, fast fill results could be obtained. This window is established to be between 5 g/L to 25 g/L.

In embodiments wherein the copper source is copper sulfate and the acid is sulfuric acid, the concentration of copper ion and acid may vary over wide limits; for example, from about 4 to about 70 g/L copper and from about 2 to about 225 g/L sulfuric acid. In this regard the compounds of the invention are suitable for use in distinct acid/copper concentration ranges, such as high acid/low copper systems, in low acid/high copper systems, and mid acid/high copper systems. In high acid/low copper systems, the copper ion concentration can be on the order of 4 g/L to on the order of 30 g/L; and the acid concentration may be sulfuric acid in an amount of greater than about 100 g/L up to about 225 g/L. In one high acid/low copper system, the copper ion concentration is about 17 g/L where the $H_2SO_4$ concentration is about 180 g/L. In some low acid/high copper systems, the copper ion concentration can be between about 35 g/L and about 60 g/L, such as between about 38 g/L and about 42 g/L. In some low acid/high copper systems, the copper ion concentration can be between about 46 g/L and about 60 g/L, such as between about 48 g/L and about 52 g/L. (35 g/L copper ion corresponds to about 140 g/L CuSO4.5H2O copper sulfate pentahydrate.) The acid concentration in these systems is preferably less than about 100 g/L. In some low acid/high copper systems, the acid concentration can be between about 5 g/L and about 30 g/L, such as between about 10 g/L and about 15 g/L. In some low acid/high copper, the acid concentration can be between about 50 g/L and about 100 g/L, such as between about 75 g/L to about 85 g/L. In an exemplary low acid/high copper system, the copper ion concentration is about 40 g/L and the $H_2SO_4$ concentration is about 10 g/L. In another exemplary low acid/high copper system, the copper ion concentration is about 50 g/L and the $H_2SO_4$ concentration is about 80 g/L. In mid acid/high copper systems, the copper ion concentration can be on the order of 30 g/L to on the order of 60 g/L; and the acid concentration may be sulfuric acid in an amount of greater than about 50 g/L up to about 100 g/L. In one mid acid/high copper system, the copper ion concentration is about 50 g/L where the $H_2SO_4$ concentration is about 80 g/L.

Chloride ion may also be used in the bath at a level up to about 200 mg/L (about 200 ppm), preferably about 10 mg/L to about 90 mg/L (10 to 90 ppm), such as about 50 gm/L (about 50 ppm). Chloride ion is added in these concentration ranges to enhance the function of other bath additives. In particular, it has been discovered that the addition of chloride ion enhances void-free filling.

Figure 7:
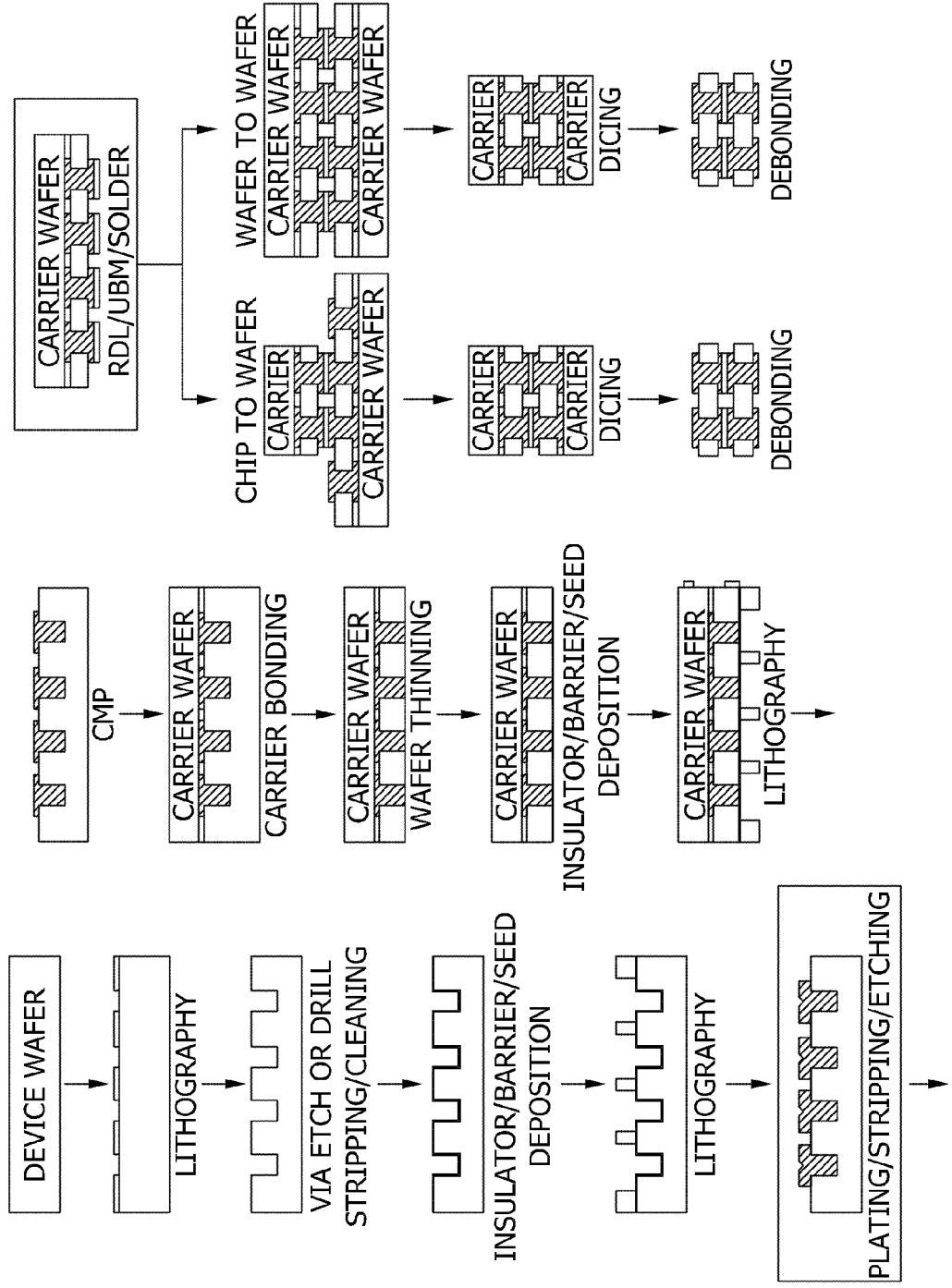
FIG. 7 is a flow chart of the through silicon via preparation process.

FIG. 7 is a flow chart of the process steps in preparing a wafer-to-wafer stack or chip-to-wafer stack involving through silicon via metallization. The wafer substrate (i.e., device wafer) for metallization using the electrolytic copper deposition solution of the present invention comprises a back surface, a front surface, and vias and through silicon vias, which are prepared by photolithography and etching methods as is conventionally known. In the context of the present invention, the front surface refers to the active side of the device wafer substrate. Accordingly, vias and through silicon vias have openings that extend from the front surface of the wafer substrate to a depth defined by the length of their sidewalls. In a typical process, conventional photoresist material is applied to a cleaned and dried surface of a device wafer by spin coating. The photoresist may be soft-baked to remove excess solvent at a temperature between about 60° C. and about 100° C. for about 5 to 30 minutes. After soft-baking, the photoresist is exposed to ultraviolet light in a manner that defines the pattern of copper metallization. Exposed photoresist is then dissolved using a developer solution. The wafer and photoresist defining the copper metallization pattern is then hard-baked, typically between about 120° C. and about 180° C. for about 20 to 30 minutes. The exposed wafer is then etched by means known in the art to define a pattern of vias having sidewalls and bottoms. The front surface of the wafer substrate and the sidewalls and the bottoms of the vias (including through silicon vias) are then coated with a barrier layer, which may be titanium nitride, tantalum, tantalum nitride, or ruthenium to inhibit copper diffusion. Next, the barrier layer is typically seeded with a seed layer of copper or other metal to initiate copper superfilling plating thereon. A copper seed layer may be applied by chemical vapor deposition (CVD), physical vapor deposition (PVD), or the like. The vias having barrier layers and copper seed layers are then plated using the electrolytic copper deposition composition and method of the present invention. Prior to metallization, the wafer surface having TSV features therein may optionally be pretreated to ensure proper wetting of the vias with the Cu filling chemistry. An exemplary solution useful for degassing the wafer surface if MICROFAB® PW 1000, available from Enthone Inc. (West Haven, Conn.). After degassing, TSV features located in the wafer is copper metallized using the electrolytic copper deposition composition of the present invention.

As a general proposition, the plating equipment is not critical to the invention. In one preferred arrangement, a cathode substrate and anode are electrically connected by wiring and, respectively, to a rectifier (power supply). The cathode substrate for direct or pulse current has a net negative charge so that copper ions in the solution are reduced at the cathode substrate forming plated copper metal on the cathode surface. An oxidation reaction takes place at the anode. This same oxidation reaction may take place at the cathode if periodic pulse reverse plating is used. The cathode and anode may be horizontally or vertically disposed in the tank.

During operation of the electrolytic plating system, copper metal is plated on the surface of a cathode substrate when the rectifier is energized. A pulse current, direct current, reverse periodic current, periodic pulse reverse current, step current or other suitable current may be employed. The temperature of the electrolytic solution may be maintained using a heater/cooler whereby electrolytic solution is removed from the holding tank and flows through the heater/cooler and then is recycled to the holding tank. The bath temperature is typically about room temperature such as about 20-27° C., but may be at elevated temperatures up to about 40° C. or higher. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank.

According to the method of electrolytic copper deposition, use of the methane sulfonic acid based electrolytic copper deposition composition containing the preferred polarizing and/or depolarizing additives of the present invention allows for enhanced filling growth rates, as shown in FIG. 1.

In one embodiment, the method of the present invention employs a current density profile in which initiation preferably occurs at a relatively low current density and in which the current density is increased after a period of copper deposition. Relatively low current densities may be used initially typically to avoid depleting copper ion locally near the bottom of the feature faster than the copper ion may be replenished. A situation wherein the depletion rate is faster than the replenishment rate may lead to the formation of a void. Optimal initial current densities and durations are typically determined experimentally and may vary depending upon the aspect ratio of the through silicon via feature. Increasing the initial relatively low current density to a relatively higher final current density may be continuous or according to a stepped profile. For example, in one embodiment, the current density may be stepped from an initiating current density to a second current density and stepped again to a final maximum current density. In one embodiment, there may be more than two current density steps, such as three, four, five, or more current density steps. Overall the current density averages between about 0.3 $A/dm^2$ and about 3 $A/dm^2$. An exemplary stepped current density profile according to the method of the present invention may be as follows:

1. Initiate plating at a current density between about 0.1 $A/dm^2$ and about 0.2 $A/dm^2$ for a duration between about 30 seconds and about 60 min.
2. Step the current density to between about 0.3 $A/dm^2$ and about 0.5 $A/dm^2$ and maintaining the current density after each step for a duration between about 1 min and about 60 min. This may involve one or more than one step, such as a step to 0.3 $A/dm^2$, followed by a step to 0.4 $A/dm^2$, followed by a step to about 0.5 $A/dm^2$.
3. Step the current density to the final current density of between about 0.6 $A/dm^2$ and about 1.2 $A/dm^2$ and maintaining the current density after each step for a duration between about 60 min and about 90 min. This may involve one or more than one step, such as a step to 0.6 $A/dm^2$, followed by a step to 0.7 $A/dm^2$, followed by a step to about 0.8 $A/dm^2$, followed by a step to about 0.9 $A/dm^2$, followed by a step to about 1.0 $A/dm^2$, followed by a step to about 1.1 $A/dm^2$, followed by a step to about 1.2 $A/dm^2$.

In the exemplary stepped current density plating profile, the increase in current density in each step may be about 0.1 $A/dm^2$, about 0.2 $A/dm^2$, about 0.3 $A/dm^2$, about 0.4 $A/dm^2$, or more. By employing a current density profile to achieve the high average current densities described above, rapid bottom-up filling of TSV may be achieved according to the method of the present invention.

With reference again to FIG. 7, after via filling, the wafer surface and exposed copper metallization may be cleaned by chemical mechanical polishing, as is known in the art. The wafer may be thinned by conventional etching techniques to expose the bottom layer of copper metallization, thereby achieving through silicon via wherein copper metallization extends from the back surface of the wafer or IC die to the front, active surface of the wafer or die. The wafer may be further processed, stacked, and singulated by methods known in the art to achieve a device comprising multiple device levels, each connected electronically using through silicon via.

Having described the invention in detail, it will be apparent that modifications and variations are possible without departing from the scope of the invention defined in the appended claims.

EXAMPLES

The following non-limiting examples are provided to further illustrate the present invention.

Example 1

Electrolytic Copper Deposition Using an Electrolytic Copper Deposition Composition of the Present Invention An electrolytic copper deposition composition according to the present invention was prepared comprising the following components:

$Cu(CH_3SO_3)2$ (copper methane sulfonate sufficient to yield 100 g/L copper ions)

$CH_3SO_3H$ (methane sulfonic acid, 10 g/L)

chloride ion (50 ppm)

MICROVAB DVF 200 Additive C (available from Enthone Inc., West Haven, Conn.) (4 mL/L) containing methyl quaternized poly(vinyl-4-pyridine).

The vias had an aspect ratio of 2.5:1 (depth:opening diameter), resulting from an opening having a diameter of 100 microns and a total depth of 250 microns. In this example, the current density profile was characterized by relatively rapid increases to a maximum current density of 0.60 A/dm$^2$.

Figure 8A:
FIGS. 8A and 8B are optical photographs of filled TSV features according to a working Example below.
Figure 8B:
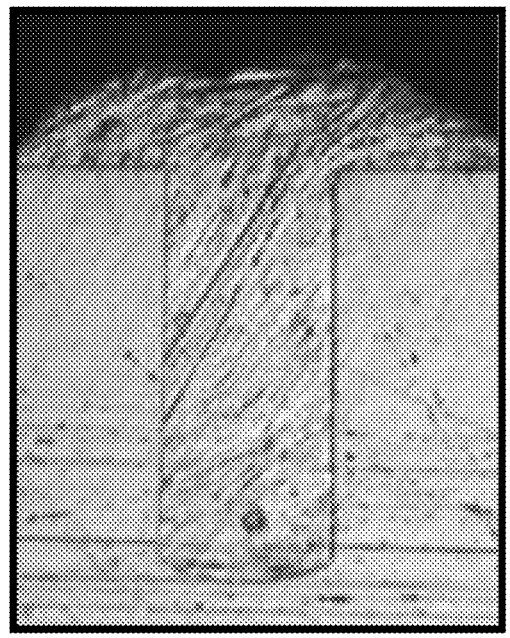

The test wafer was degassed using MICROFAB® PW 1000 (available from Enthone Inc., West Haven, Conn.) and then immersed in the electrolytic copper deposition composition. The anode was a copper anode that was filmed prior to use in a copper methane sulfonate plating bath. The power supply supplied an average current density of 0.57 A/dm$^2$. The current density was supplied according to the following stepped profile:

0.1 A/dm$^2$ for 3 minutes
0.3 A/dm$^2$ for 5 minutes
0.6 A/dm$^2$ for 300 minutes Plating was discontinued after about 318 minutes. FIGS. 8A and 8B are cross sections of the completely filled TSV features. Plating appears to occur according to a bottom-up mechanism since the TSV were void-free and seam-free.

Example 2

Electrolytic Copper Deposition Using an Electrolytic Copper Deposition Composition of the Present Invention An electrolytic copper deposition composition according to the present invention was prepared comprising the following components:

Cu(CH$_3$SO$_3$)$_2$ (copper methane sulfonate sufficient to yield 100 g/L copper ions)
CH$_3$SO$_3$H (methane sulfonic acid, 10 g/L)
Chloride ion (50 ppm)
MICROVAB DVF 200 Additives B & C (available from Enthone Inc., West Haven, Conn.):
MICROFAB DVF 200 B (4 mL/L)(containing 3,3'-dithiobis(1-propanesulfonic acid)
MICROFAB DVF 200 C (4 mL/L)

The vias had an aspect ratio of 1.75:1; 2.16:1; 3:1; and 5:1 (depth:opening diameter), resulting from an opening having the following diameters, respectively: 40, 30, 20, 10 microns, and the following depths, respectively: 70, 65, 60, 50 microns. In this example, the current density profile was characterized by relatively rapid increases to a maximum current density of 1.4 A/dm$^2$.

Figure 9A:
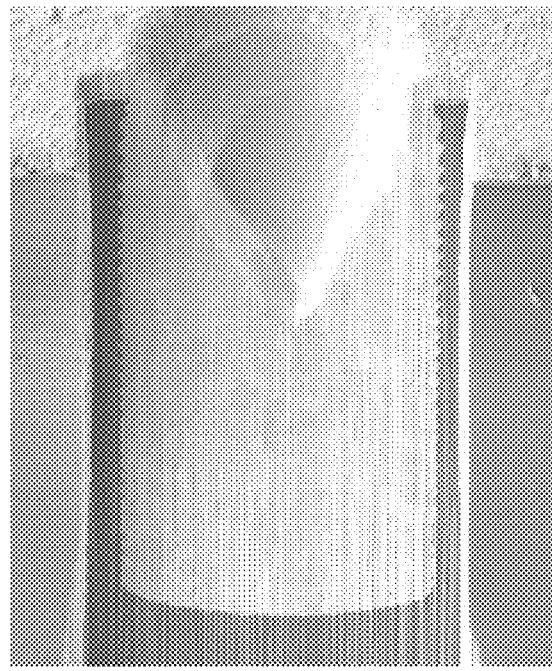
FIGS. 9A, B, C, and D are optical photographs of filled TSV features according to a working Example below.
Figure 9B:
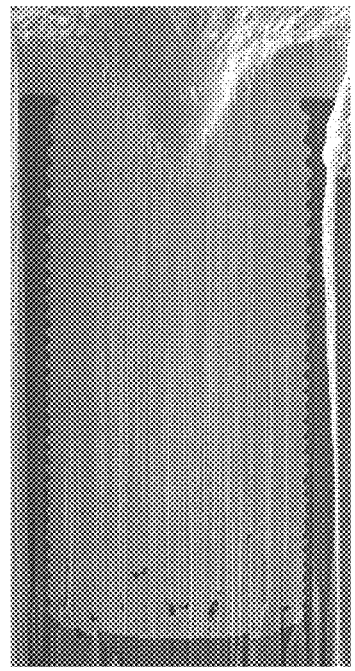
Figure 9C:
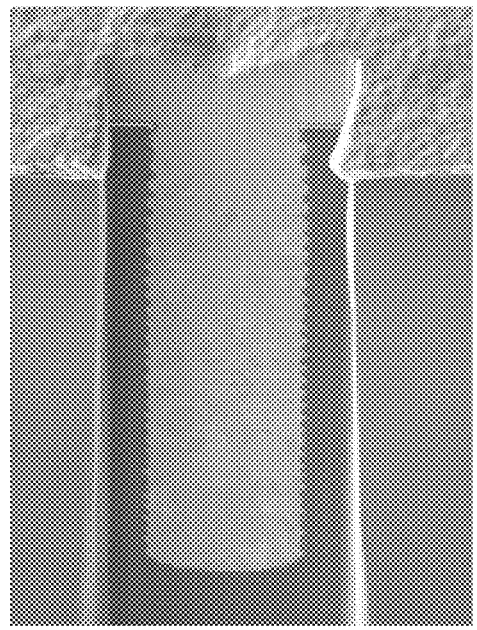
Figure 9D:
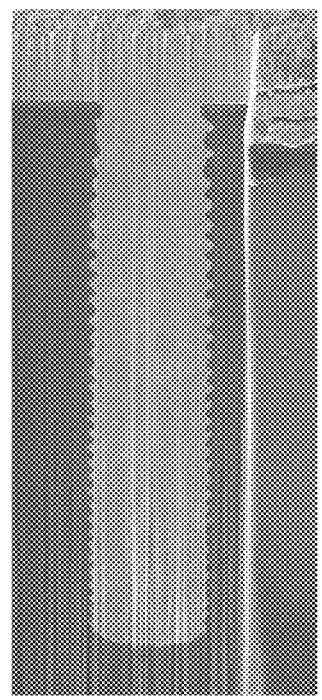

The test wafer was degassed using MICROFAB® PW 1000 (available from Enthone Inc., West Haven, Conn.) and then immersed in the electrolytic copper deposition composition. The anode was a copper anode that was filmed prior to use in a copper methane sulfonate plating bath. The power supply supplied an average current density of 0.84 A/dm$^2$. The current density was supplied according to the following stepped profile:

0.1 A/dm$^2$ for 3 minutes
0.3 A/dm$^2$ for 3 minutes
0.6 A/dm$^2$ for 30 minutes
1.2 A/dm$^2$ for 15 minutes
1.4 A/dm$^2$ for 30 minutes Plating was discontinued after about 61 minutes. FIGS. 9A, B, C, and D are FIB (Focused Ion Beam) cross sections of the completely filled TSV features. Plating appears to occur according to a bottom-up mechanism since the TSV were void-free and seam-free.

Example 3

Electrolytic Copper Deposition Using an Electrolytic Copper Deposition Composition of the Present Invention An electrolytic copper deposition composition according to the present invention was prepared comprising the following components:

Cu(CH$_3$SO$_3$)$_2$ (copper methane sulfonate sufficient to yield 100 g/L copper ions)
CH$_3$SO$_3$H (methane sulfonic acid, 10 g/L)
chloride ion (50 ppm)
MICROVAB DVF 200 Additives B & C (available from Enthone Inc., West Haven, Conn.):
MICROFAB DVF 200 B (5.5 mL/L)
MICROFAB DVF 200 C (7 ml/L)
Polypropylene glycol amine (ca. 400 g/mol) 30 mg/L The vias had an aspect ratio of 3.5:1; 3.8:1; 2.5:1; and 5:1 (depth:opening diameter), resulting from an opening having the following diameters respectively: 50; 45; 75; 35 microns; and all having a depth of 175 microns. In this example, the current density profile was characterized by relatively rapid increases to a maximum current density of 1.2 A/dm$^2$.

Figure 10A:
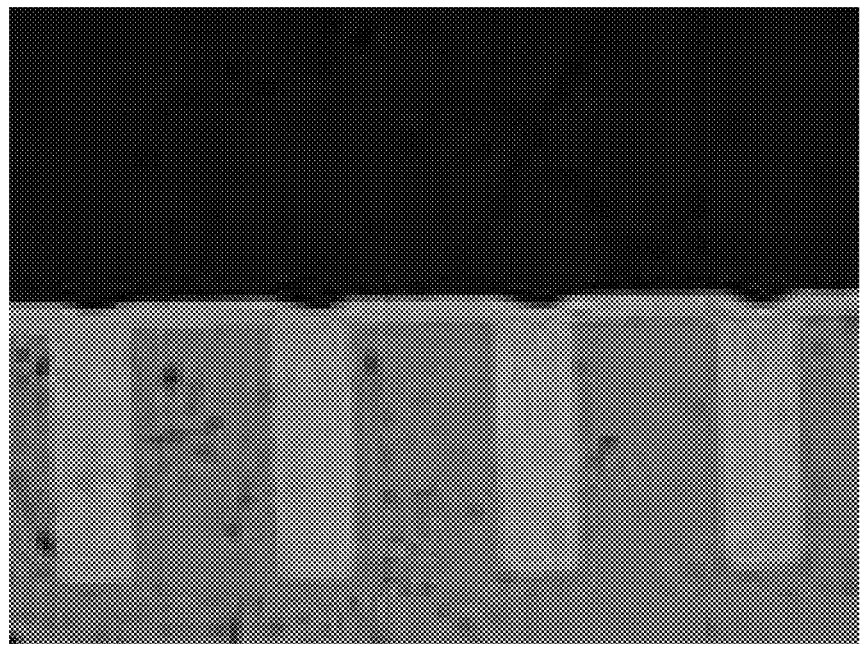
FIGS. 10A, B, C, and D are optical photographs of filled TSV features according to a working Example below.
Figure 10B:
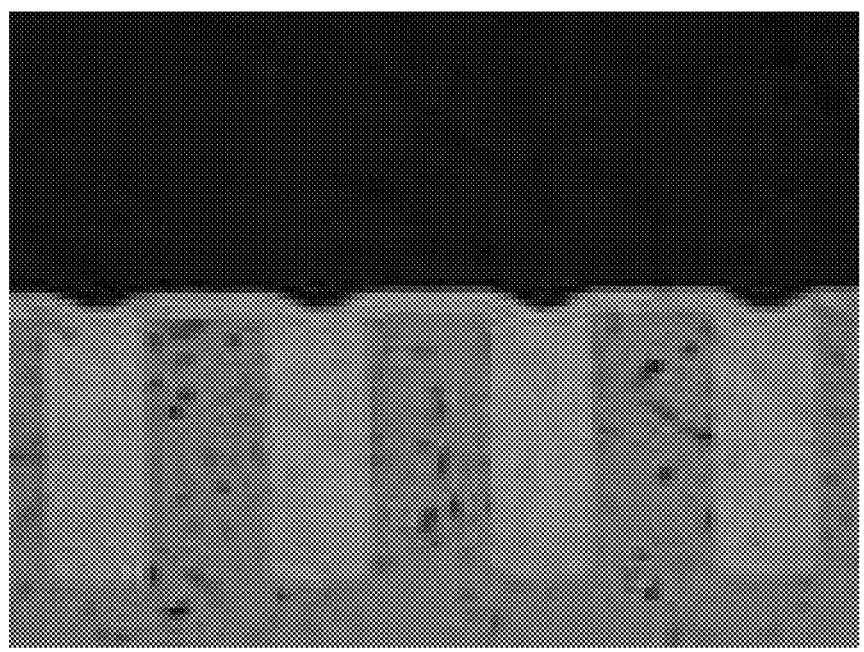
Figure 10C:
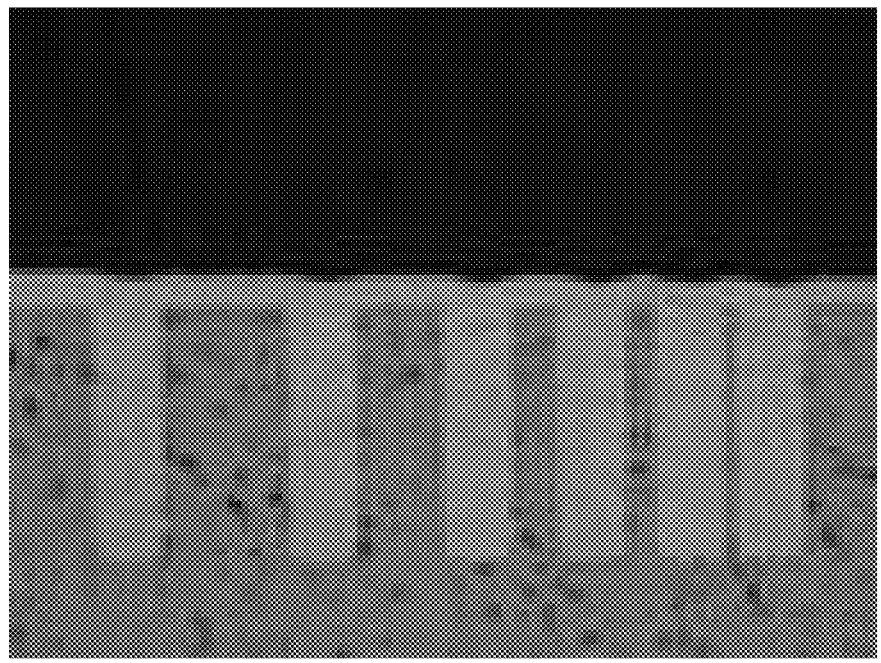
Figure 10D:
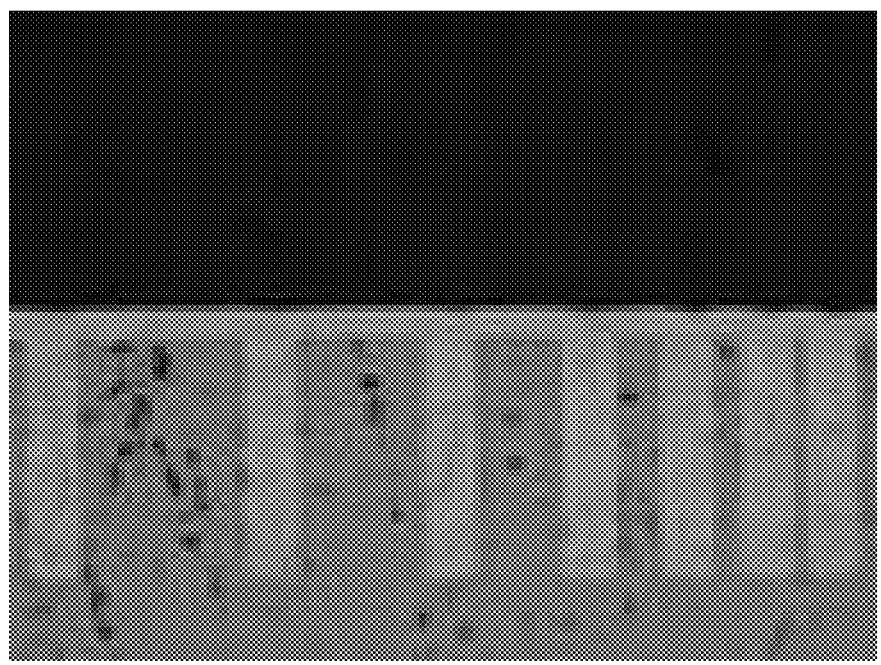

The test wafer was degassed using MICROFAB® PW 1000 (available from Enthone Inc., West Haven, Conn.) and then immersed in the electrolytic copper deposition composition. The anode was a copper anode that was filmed prior to use in a copper methane sulfonate plating bath. The power supply supplied an average current density of 0.93 A/dm$^2$. The current density was supplied according to the following stepped profile:

0.1 A/dm$^2$ for 5 minutes
0.3 A/dm$^2$ for 5 minutes
0.6 A/dm$^2$ for 60 minutes
1.2 A/dm$^2$ for 100 minutes Plating was discontinued after about 170 minutes. FIGS. 10A, B, C, and D are optical cross sections of the completely filled TSV features. Plating appears to occur according to a bottom-up mechanism since the TSV were void-free and seam-free.

Example 4

Electrolytic Copper Deposition Using an Electrolytic Copper Deposition Composition of the Present Invention An electrolytic copper deposition composition having a composition:

An electrolytic copper deposition composition according to the present invention was prepared comprising the following components:

Cu(CH$_3$SO$_3$)$_2$ (copper methane sulfonate sufficient to yield 100 g/L copper ions)
CH$_3$SO$_3$H (methane sulfonic acid, 10 g/L)
chloride ion (50 ppm)
MICROVAB DVF 200 Additives B & C (available from Enthone Inc., West Haven, Conn.):
MICROFAB DVF 200 B (5.5 mL/L)
MICROFAB DVF 200 C (7 ml/L)

Polypropylene gycol amine (ca. 400 g/mol; 30 mg/L)
Octyldipropionate (200 microliters)

The vias had an aspect ratio of 3.5:1; 2.5:1 (depth:opening diameter), resulting from an opening having the following diameters respectively: 50; 75 microns; and each having a depth of 175 microns. In this example, the current density profile was characterized by relatively rapid increases to a maximum current density of 1.2 A/dm$^2$.

Figure 11A:
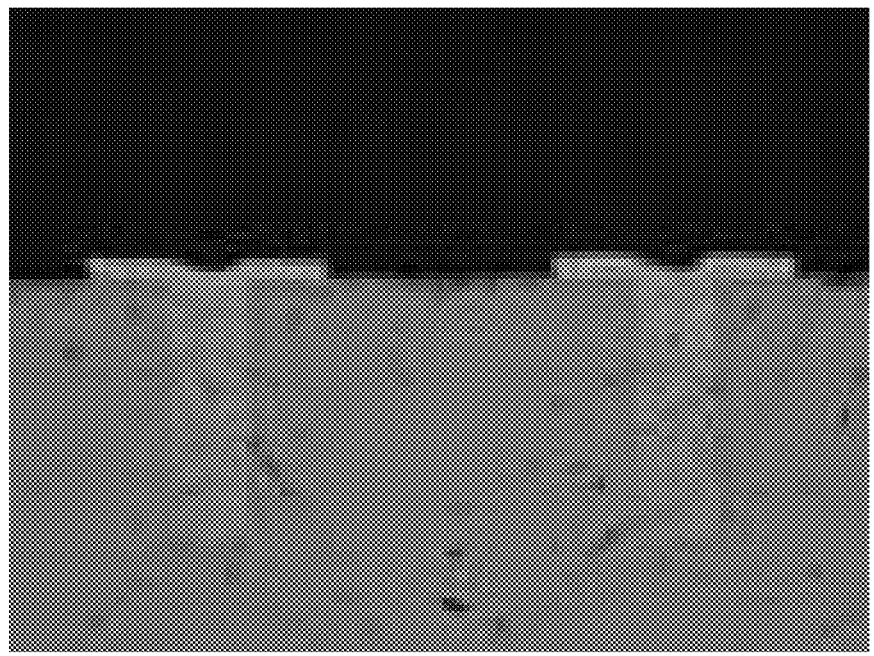
FIGS. 11A and 11B are optical photographs of filled TSV features according to a working Example below.
Figure 11B:
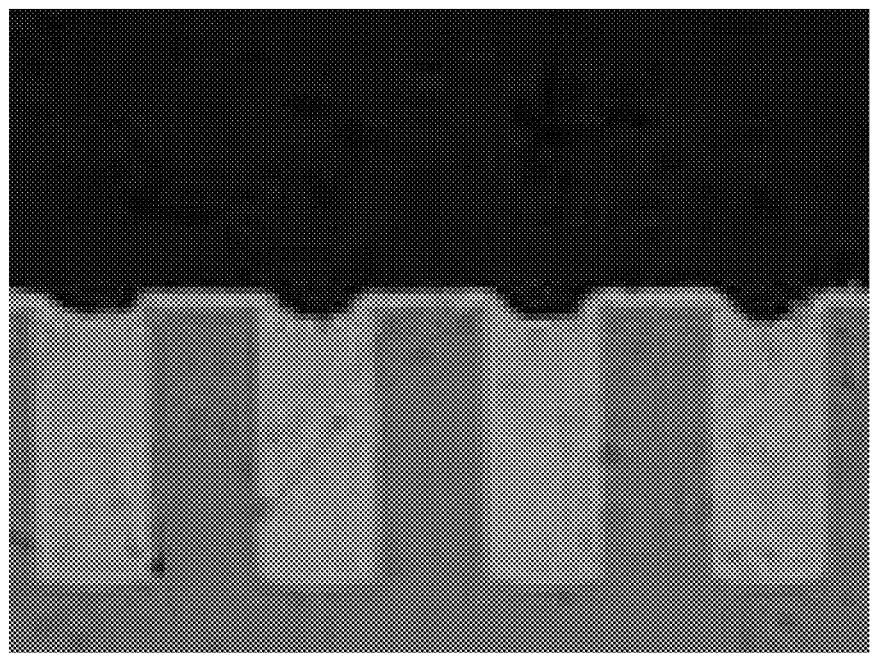

The test wafer was degassed using MICROFAB® PW 1000 (available from Enthone Inc., West Haven, Conn.) and then immersed in the electrolytic copper deposition composition. The anode was a copper anode that was filmed prior to use in a copper methane sulfonate plating bath. The power supply supplied an average current density of 0.93 A/dm$^2$. The current density was supplied according to the following stepped profile:

0.1 A/dm$^2$ for 5 minutes
0.3 A/dm$^2$ for 5 minutes
0.6 A/dm$^2$ for 60 minutes
1.2 A/dm$^2$ for 100 minutes Plating was discontinued after about 170 minutes. The following FIGS. 11A and B are optical cross sections of the completely filled TSV features. Plating appears to occur according to a bottom-up mechanism since the TSV were void-free and seam-free.

Example 5

Electrolytic Copper Deposition Composition of the Present Invention

An electrolytic copper deposition composition according to the present invention was prepared comprising the following components:

Cu(CH$_3$SO$_3$)$_2$ (copper methane sulfonate sufficient to yield 100 g/L copper ions)
CH$_3$SO$_3$H (methane sulfonic acid, 10 g/L)
chloride ion (50 ppm)
MICROFAB DVF200 B & C (available from Enthone Inc., West Haven, Conn.) and Synalox (polarizer):
MICROFAB DVF 200 B (6 mL/L)
Synalox 40-D700 (0.2 g/L) (random EO/PO copolymer available from Dow Chemical; m.w. 5300)
MICROFAB DVF 200 C (4 mL/L)

Example 6

Electrolytic Copper Deposition Using an Electrolytic Copper Deposition Composition of the Present Invention The electrolytic copper deposition composition of Example 5 was used to deposit copper metallization into a large size via in a test wafer substrate. The vias had an opening having a diameter of 50 microns and a total depth of 135 microns.

The test wafer was degassed using MICROFAB® PW 1000 (available from Enthone Inc., West Haven, Conn.) and then immersed in the electrolytic copper deposition composition of Example 5. The anode was a copper anode that was filmed prior to use in a copper methane sulfonate plating bath. The power supply supplied an average current density of 0.50 A/dm2. The current density was supplied according to the following stepped profile:

0.1 A/dm$^2$ for 60 minutes
0.3 A/dm$^2$ for 60 minutes
0.4 A/dm$^2$ for 30 minutes
0.5 A/dm$^2$ for 30 minutes
0.6 A/dm$^2$ for 30 minutes
0.7 A/dm$^2$ for 30 minutes
1.0 A/dm$^2$ for 60 minutes.

Figure 12A:
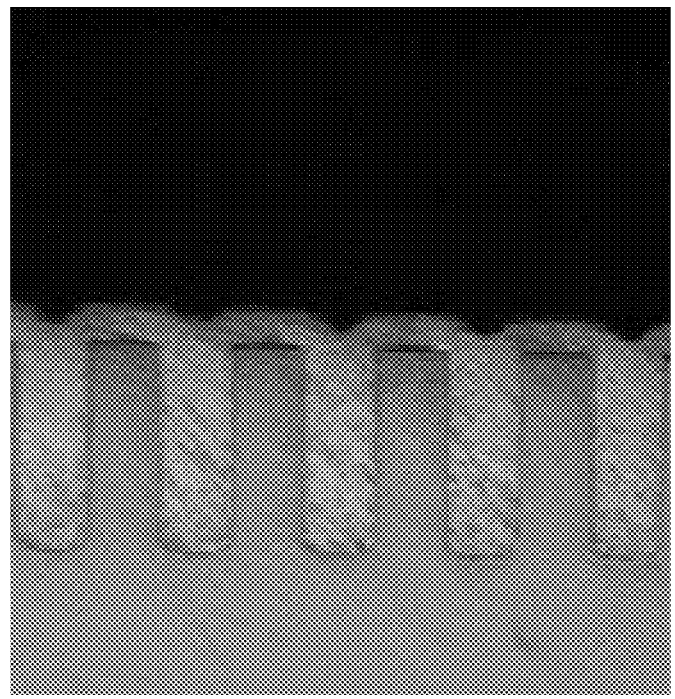
FIGS. 12A and 12B are optical photographs of TSV features filled according to a working Example below.
Figure 12B:
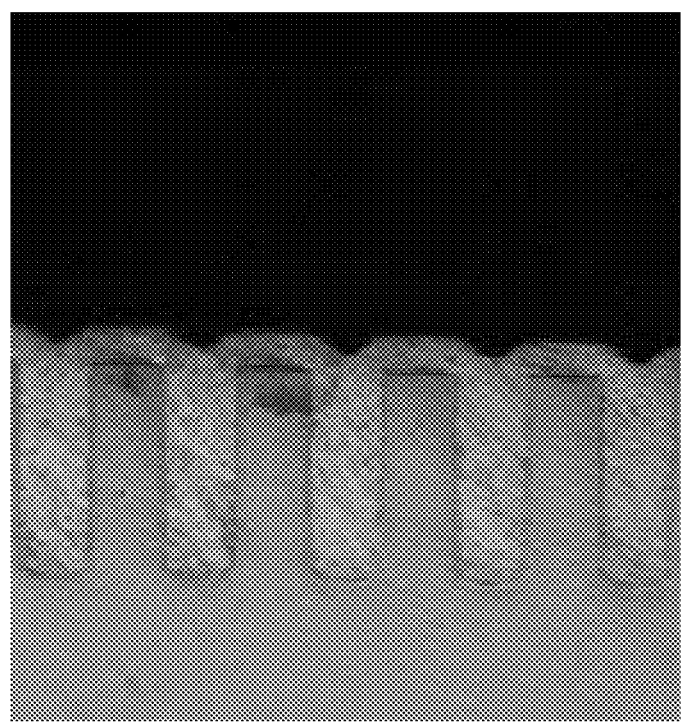

Plating continued until the feature was completely filled with copper metal. The plating duration was about 300 minutes. FIGS. 12A and 12B are optical photographs (500× magnification) of filled TSV features. Plating appears to occur according to a bottom-up mechanism since void-free and seam-free copper filled TSV were obtained.

Example 7

Electrolytic Copper Deposition Composition of the Present Invention

An electrolytic copper deposition composition according to the present invention was prepared comprising the following components:

Cu(CH$_3$SO$_3$)$_2$ (copper methane sulfonate sufficient to yield 100 g/L copper ions)
CH$_3$SO$_3$H (methanesulfonic acid, 10 g/L)
chloride ion (50 ppm)
MICROFAB DVF200 B (3,3'-dithiobis(1-propanesulfonic acid) (6 mL/L)
MIROFAB DVF200 C (Methyl quaternized poly(vinyl-4-pyridine) (4 mL/L).

Example 8

Electrolytic Copper Deposition Using an Electrolytic Copper Deposition Composition of the Present Invention The electrolytic copper deposition composition of Example 7 was used to deposit copper metallization into a large size via in a test wafer substrate. The vias had an opening having a diameter of 50 microns and a total depth of 200 microns.

Figure 13A:
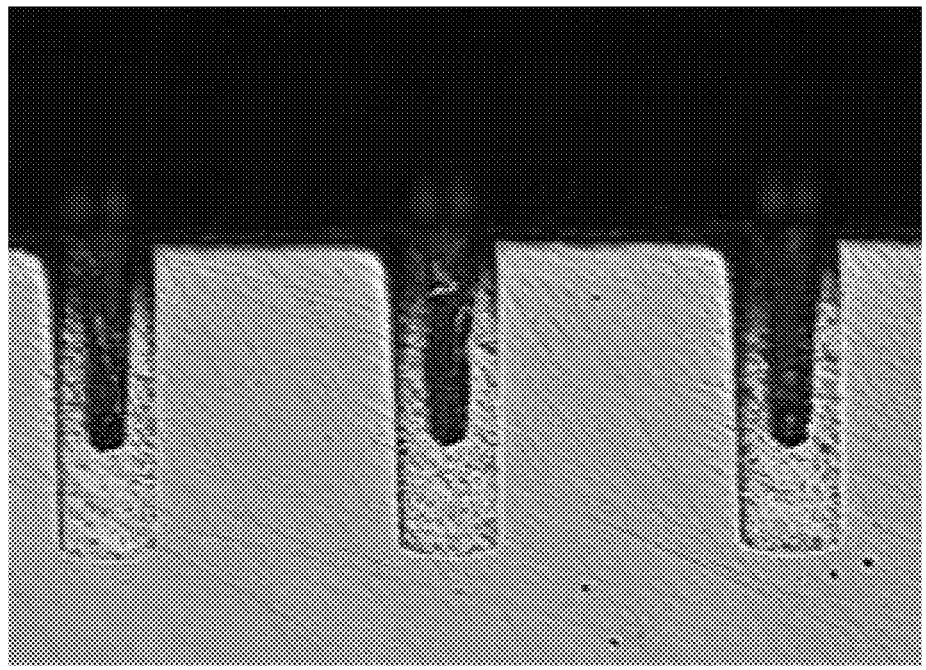
FIGS. 13A and 13B are optical photographs of TSV features filled according to a working Example below.
Figure 13B:
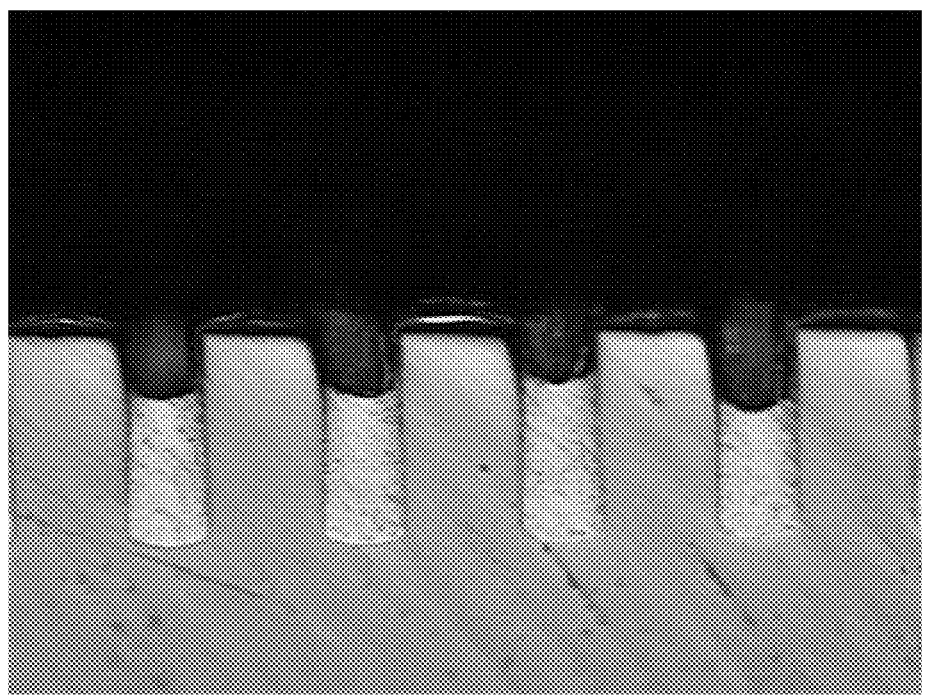

The test wafer was degassed using MICROFAB® PW 1000 (available from Enthone Inc., West Haven, Conn.) and then immersed in the electrolytic copper deposition composition of Example 7. The anode was a copper anode that was filmed prior to use in a copper methane sulfonate plating bath. The power supply supplied an average current density of 0.64 A/dm$^2$. The current density was supplied according to the following stepped profile:

0.1 A/dm$^2$ for 5 minutes
0.3 A/dm$^2$ for 5 minutes
0.4 A/dm$^2$ for 5 minutes
0.5 A/dm$^2$ for 90 minutes
0.6 A/dm$^2$ for 90 minutes
1.0 A/dm$^2$ for 60 minutes Plating was discontinued at 3 hours to monitor to growth of the copper deposit. FIGS. 13A and 13B are optical photographs (500× magnification) of the partially filled TSV features. Plating appears to occur according to a true bottom-up mechanism as indicated by the "U" shaped plating profile.

Example 9

Electrolytic Copper Deposition Using an Electrolytic Copper Deposition Composition of the Present Invention The electrolytic copper deposition composition of Example 7 was used to deposit copper metallization into a large size via in a test wafer substrate. The vias had an aspect ratio of 3:1 (depth:opening diameter), resulting from an opening having a diameter of 50 microns and a total depth of 150 microns. In this example, the current density profile was characterized by relatively rapid increases to a maximum current density of 0.60 A/dm$^2$.

The test wafer was degassed using MICROFAB® PW 1000 (available from Enthone Inc., West Haven, Conn.) and then immersed in the electrolytic copper deposition composition of Example 7. The anode was a copper anode that was filmed prior to use in a copper methane sulfonate plating bath. The power supply supplied an average current density of 0.58 A/dm$^2$. The current density was supplied according to the following stepped profile:

0.10 A/dm$^2$ for 5 minutes
0.30 A/dm$^2$ for 5 minutes
0.60 A/dm$^2$ for 2 hours and 50 minutes.

Figure 14A:
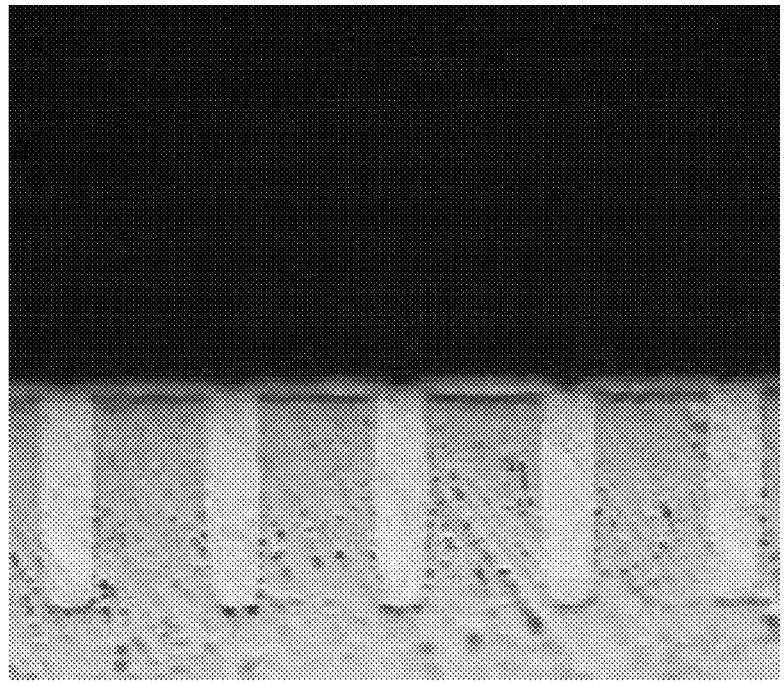
FIGS. 14A and 14B are optical photographs of TSV features filled according to a working Example below.
Figure 14B:
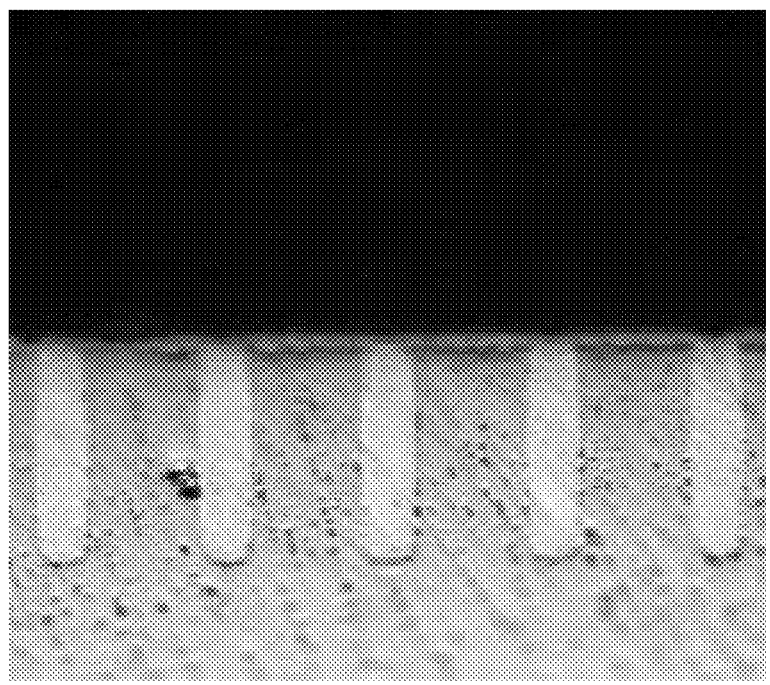

Plating was discontinued at 3 hours. FIGS. 14A and 14B are optical photographs (200× magnification) of the completely filled TSV features. Plating appears to occur according to a bottom-up mechanism since the TSV were void-free and seam-free.

Example 10

Electrolytic Copper Deposition Using an Electrolytic Copper Deposition Composition of the Present Invention An electrolytic copper deposition composition having a composition identical to that of Example 7 except for an increase in the concentration of the methyl quaternized poly(vinyl-4-pyridine) to 8 mL/L was used to deposit copper metallization into a large size, high aspect ratio via in a test wafer substrate. The vias had an aspect ratio of 4:1 (depth:opening diameter), resulting from an opening having a diameter of 50 microns and a total depth of 200 microns. In this example, the current density profile was characterized by relatively rapid increases to a maximum current density of 0.60 A/dm$^2$.

The test wafer was degassed using MICROFAB® PW 1000 (available from Enthone Inc., West Haven, Conn.) and then immersed in the electrolytic copper deposition composition. The anode was a copper anode that was filmed prior to use in a copper methane sulfonate plating bath. The power supply supplied an average current density of 0.64 A/dm$^2$. The current density was supplied according to the following stepped profile:

0.1 A/dm$^2$ for 5 minutes
0.3 A/dm$^2$ for 5 minutes
0.4 A/dm$^2$ for 5 minutes
0.5 A/dm$^2$ for 90 minutes
0.6 A/dm$^2$ for 90 minutes
1.0 A/dm$^2$ for 60 minutes.

Figure 15A:
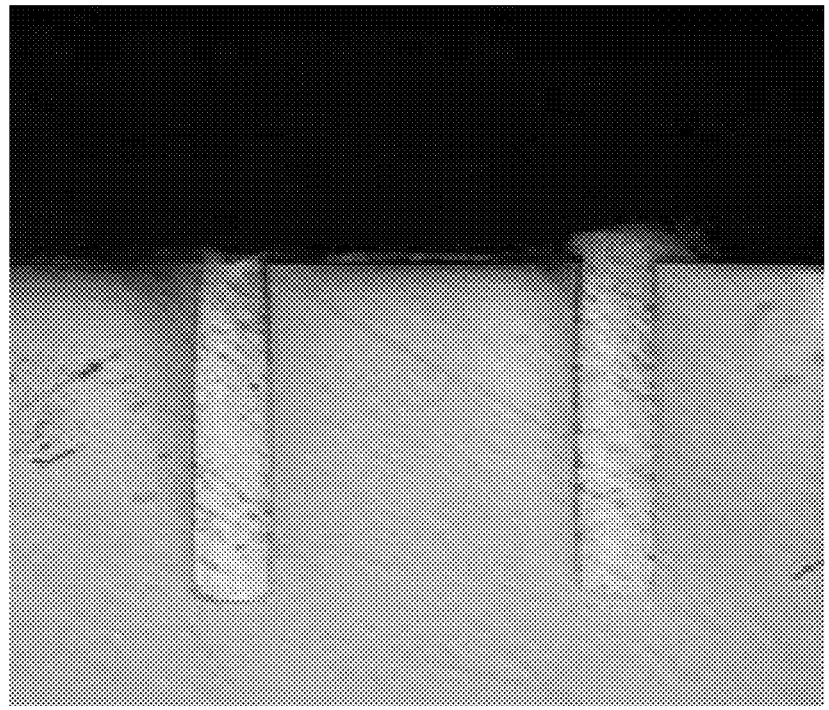
FIGS. 15A and 15B are optical photographs of TSV features filled according to a working Example below.
Figure 15B:
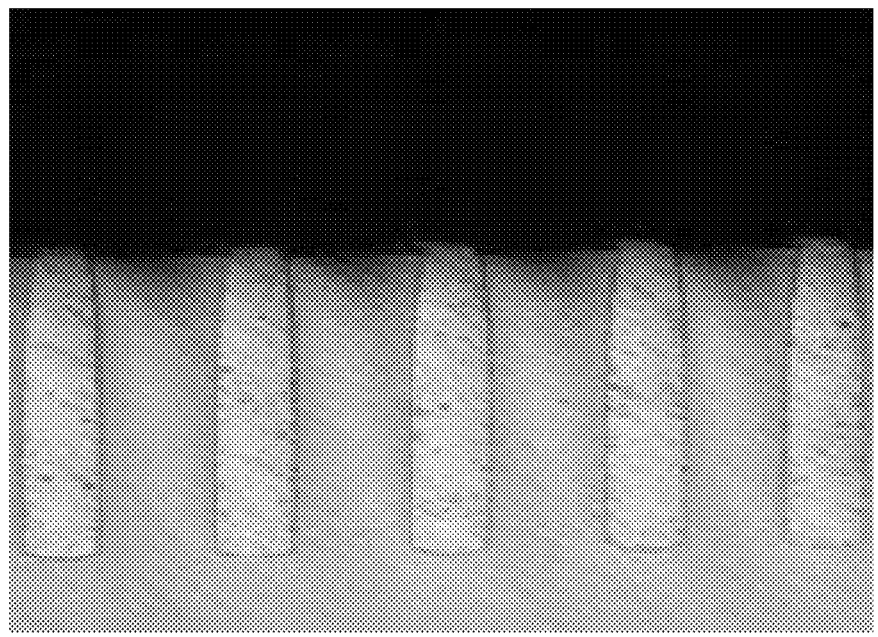

Plating was discontinued after about 255 minutes. FIGS. 15A and 15B are optical photographs (200× magnification) of the completely filled TSV features. Plating appears to occur according to a bottom-up mechanism since the TSV were void-free and seam-free.

Comparative Example 1

Electrolytic Copper Deposition Composition Comprising Superfilling Additives

An electrolytic copper deposition composition comprising superfilling additives was prepared comprising the following components:

CuSO$_4$.5H$_2$O (about 196 g of copper sulfate pentahydrate is sufficient to yield about 50 g/L copper ions in a 1 liter composition)

H$_2$SO$_4$ (sulfuric acid, 80 g/L)

chloride ion (50 ppm)

MICROFAB® DVF 100 Additives (available from Enthone Inc., West Haven, Conn.)

MICROFAB® DVF 100 A (10 mL/L)
MICROFAB® DVF 100 S (2 mL/L)
MICROFAB® DVF 100 L (4 mL/L)

Comparative Example 2

Electrolytic Copper Deposition using the Composition Comprising Superfilling Additives The electrolytic copper deposition composition of Comparative Example 1 was used to deposit copper metallization into a large size via in a test wafer substrate. The via had an opening having a diameter of 50 microns and a total depth of 150 microns. In this example, the current density was relatively low to ensure good initiation, bottom up filling, and defect-free metallization.

Figure 16:
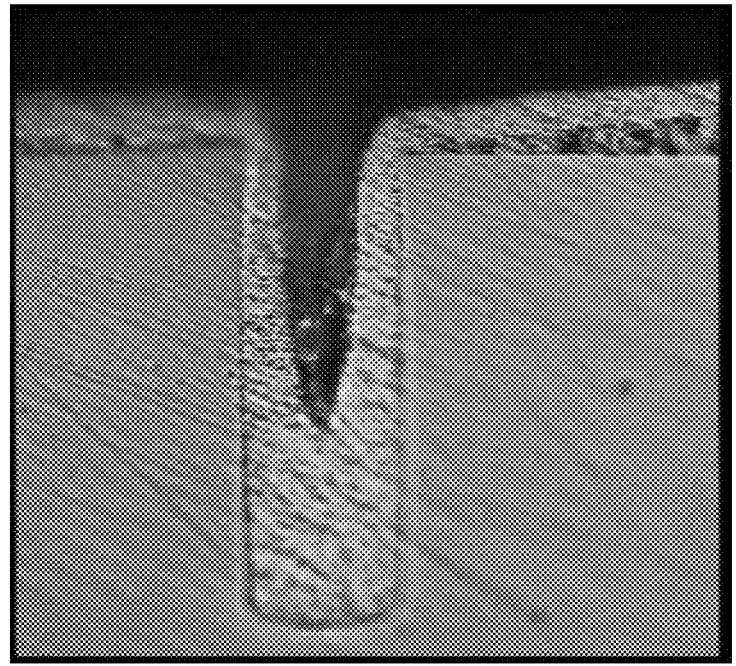
FIG. 16 is an optical photograph of a partially filled TSV feature. The feature was metallized according to the method described a Comparative Example.

The test wafer was degassed using MICROFAB® PW 1000 (available from Enthone Inc., West Haven, Conn.) and then immersed in the electrolytic copper deposition composition of Comparative Example 1. The anode was a copper anode that was filmed prior to use in a copper sulfate plating bath. The power supply supplied a current density of 0.11 A/dm$^2$ and plating was discontinued after five hours. FIG. 16 is an optical photograph (500× magnification) of the partially filled TSV feature. It is apparent from FIG. 16 that 5 hours of plating at this current density was not sufficient to metallize the entire feature. In fact, the feature was only about 33% filled.

Comparative Example 3

Electrolytic Copper Deposition Composition Comprising Superfilling Additives

An electrolytic copper deposition composition comprising superfilling additives was prepared comprising the following components:

CuSO$_4$.5H$_2$O (about 196 g of copper sulfate pentahydrate is sufficient to yield about 50 g/L copper ions in a 1 liter composition)

H$_2$SO$_4$ (sulfuric acid, 80 g/L)

chloride ion (50 ppm)

MICROFAB® DVF 100® Additives (available from Enthone Inc., West Haven, Conn.)
 MICROFAB® DVF 100 A (6 mL/L)
 MICROFAB® DVF 100 S (2 mL/L)
 MICROFAB® DVF 100 L (3 mL/L).

Comparative Example 4

Electrolytic Copper Deposition Using the Composition Comprising Superfilling Additives The electrolytic copper deposition composition of Comparative Example 3 was used to deposit copper metallization into a large size via in a test wafer substrate. The via had an opening having a diameter of 50 microns and a total depth of 150 microns. In this example, the current density was relatively low to ensure good initiation, bottom up filling, and defect-free metallization.

Figure 17:
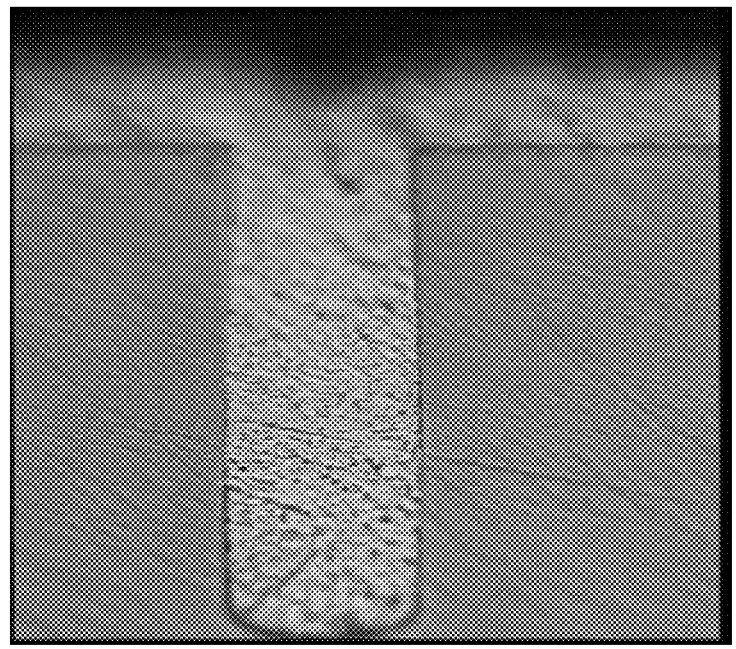
FIG. 17 is an optical photograph of TSV feature metallized according to the method described in a Comparative Example.

The test wafer was degassed using MICROFAB® PW 1000 (available from Enthone Inc., West Haven, Conn.) and then immersed in the electrolytic copper deposition composition of Comparative Example 3. The anode was a copper anode that was filmed prior to use in a copper sulfate plating bath. The power supply supplied a current density of 0.11 A/dm² and plating continued until the feature was completely filled with copper metal. FIG. 17 is an optical photograph (500× magnification) of the filled TSV feature. Deposition was characterized by bottom up growth, and the metallization was void-free and defect-free. The plating rate in the vertical direction was very slow however, about 0.27 microns/minute, and although the metallized feature was defect-free, filling the entire feature took 10 hours.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and processes without departing from the scope of the invention, it is intended that all matter contained in the above description and shown in the accompanying drawings shall be interpreted as illustrative and not in a limiting sense.

What is claimed is:

1. A method for metallizing a through silicon via feature in a semiconductor integrated circuit device substrate, wherein the semiconductor integrated circuit device substrate comprises a front surface, a back surface, and the via feature and wherein the via feature comprises an opening in the front surface of the substrate, a sidewall extending from the front surface of the substrate, and a bottom, the method comprising:
 immersing the semiconductor integrated circuit device substrate into an electrolytic copper deposition composition, wherein the through silicon via feature has an entry dimension between 5 microns and 300 microns, a depth dimension between 50 microns and 250 microns, and an aspect ratio greater than about 0.3:1, the deposition composition comprising:
  (a) a source of copper ions;
  (b) an acid selected from among an inorganic acid, organic sulfonic acid, and mixtures thereof;
  (c) one or more organic compounds selected from among polarizers and/or depolarizers, which one or more organic compounds promotes faster copper deposition at the via bottom than at the via opening; and
  (d) chloride ions; and
 supplying electrical current to the electrolytic deposition composition to deposit copper metal onto the bottom and sidewall for bottom-up filling to thereby yield a copper filled via feature.

2. The method of claim 1 wherein the via feature has an entry dimension between about 10 and about 100 microns.

3. The method of claim 1 wherein the source of copper ions is an organic copper sulfonate and the acid is the sulfonic acid.

4. The method of claim 1 wherein the one or more organic compounds consists of a polarizer.

5. The method of claim 1 wherein the polarizer is a vinyl pyridine based compound.

6. The method of claim 5 wherein the vinyl pyridine based compound is a substituted pyridyl polymer compound having a molecular weight of less than about 160,000 g/mol.

7. The method of claim 5 wherein the vinyl pyridine based compound is a substituted pyridyl polymer compound having a molecular weight of between about 500 g/mol and about 150,000 g/mol.

8. The method of claim 5 wherein the vinyl pyridine based compound is methyl quaternized poly(vinyl-4-pyridine).

9. The method of claim 5 wherein the polarizer further comprises poly(propylene glycol)bis(2-aminopropyl ether).

10. The method of claim 5 wherein the polarizer further comprises a random ethylene oxide/propylene oxide copolymer.

11. The method of claim 1 wherein the one or more polarization compounds consists of a polarizer and a depolarizer.

12. The method of claim 11 wherein the polarizer is methyl quaternized poly(vinyl-4-pyridine).

13. The method of claim 11 wherein the depolarizer is an organic sulfur compound having the following general structure (1):

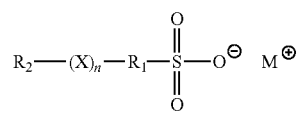

Structure (1)

wherein
 X is O, S, or S=O;
 n is 1 to 6;
 M is hydrogen, alkali metal, or ammonium as needed to satisfy the valence;
 $R_1$ is an alkylene or cyclic alkylene group of 1 to 8 carbon atoms, an aromatic hydrocarbon or an aliphatic aromatic hydrocarbon of 6 to 12 carbon atoms; and
 $R_2$ is hydrogen, hydroxyalkyl having from 1 to 8 carbon atoms, or $MO_3SR_1$ wherein M and $R_1$ are as defined above.

14. The method of claim 11 wherein the depolarizer is 3,3'-dithiobis(1-propanesulfonic acid).

15. The method of claim 11 wherein the polarizer is methyl quaternized poly(vinyl-4-pyridine) and the depolarizer is 3,3'-dithiobis(1-propanesulfonic acid).

16. The method of claim 1 wherein the one or more polarization compounds yields a copper deposition potential at the via bottom which is at least about 50 millivolts less negative than a copper deposition potential at the via opening.

17. The method of claim 1 wherein the via feature has an entry dimension between about 5 and about 100 microns.

18. The method of claim 1 wherein the via feature has an aspect ratio between about 0.3:1 and about 5:1.

19. The method of claim 1 wherein the via feature has an aspect ratio between about 1.75:1 and about 5:1.

20. A method for metallizing a via feature in a semiconductor integrated circuit device substrate, wherein the semiconductor integrated circuit device substrate comprises a front surface, a back surface, and the via feature and wherein the via feature comprises an opening in the front surface of the substrate, a sidewall extending from the front surface of the substrate, and a bottom, the method comprising:

immersing the semiconductor integrated circuit device substrate into an electrolytic copper deposition composition, wherein the via feature has a depth between about 50 and about 250 microns, and a via feature entry dimension between about 5 and about 100 microns, the deposition composition consisting essentially of:

(a) copper methane sulfonate as a source of between about 50 and about 110 g/L copper ions;

(b) methane sulfonic acid in a concentration between about 1 and about 25 g/L;

(c) one or more organic compounds selected from among polarizers at a concentration between about 1 and about 200 ppm and depolarizers at a concentration between about 3 micromolar and about 100 micromolar, which one or more organic compounds promotes a faster copper deposition at the via bottom than at the via opening; and (d) chloride ions in a concentration between about 10 and about 90 mg/L; and supplying electrical current at an average current density between about 0.3 A/dm$^2$ and about 5 A/dm$^2$ to the electrolytic deposition composition to deposit copper metal onto the bottom and sidewall for bottom-up filling to thereby yield a copper filled via feature.

21. The method of claim 20 wherein the one or more organic compounds are a polarizer which is methyl quaternized poly(vinyl-4-pyridine) in a concentration between about 1 and about 40 ppm and a depolarizer which is 3,3'-dithiobis(1-propanesulfonic acid) in a concentration between about 1 PPM and about 50 PPM.

* * * * *